US011222978B2

(12) United States Patent
Lee et al.

(10) Patent No.: US 11,222,978 B2
(45) Date of Patent: Jan. 11, 2022

(54) SEMICONDUCTOR DEVICE AND METHOD OF FABRICATING THE SAME

(71) Applicant: Samsung Electronics Co., Ltd., Suwon-si (KR)

(72) Inventors: Yul Lee, Seoul (KR); Yuri Masuoka, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 172 days.

(21) Appl. No.: 16/019,811

(22) Filed: Jun. 27, 2018

(65) Prior Publication Data

US 2019/0280123 A1    Sep. 12, 2019

(51) Int. Cl.
| | |
|---|---|
| *H01L 31/072* | (2012.01) |
| *H01L 29/78* | (2006.01) |
| *H01L 29/66* | (2006.01) |
| *H01L 21/28* | (2006.01) |
| *H01L 21/762* | (2006.01) |
| *H01L 29/08* | (2006.01) |

(52) U.S. Cl.
CPC .... *H01L 29/7848* (2013.01); *H01L 21/28167* (2013.01); *H01L 21/76264* (2013.01); *H01L 29/0895* (2013.01); *H01L 29/66621* (2013.01); *H01L 29/66628* (2013.01); *H01L 29/66636* (2013.01); *H01L 29/66651* (2013.01); *H01L 29/785* (2013.01); *H01L 29/7833* (2013.01)

(58) Field of Classification Search
CPC ........ H01L 21/28167; H01L 21/76264; H01L 29/66621; H01L 29/66628; H01L 29/66636; H01L 29/66651; H01L 29/7833; H01L 29/7848; H01L 29/0653

USPC .................................................. 257/190–196
See application file for complete search history.

(56) References Cited

U.S. PATENT DOCUMENTS

| | | | |
|---|---|---|---|
| 4,910,165 A | 3/1990 | Lee et al. | |
| 6,346,729 B1* | 2/2002 | Liang ................. | H01L 29/0653 257/344 |
| 6,475,868 B1* | 11/2002 | Hao .................. | H01L 21/26506 438/301 |
| 7,232,728 B1 | 6/2007 | Lee et al. | |
| 8,404,546 B2 | 3/2013 | Woon et al. | |
| 8,716,090 B2 | 5/2014 | Qin et al. | |
| 8,754,448 B2 | 6/2014 | Liao et al. | |
| 9,543,387 B2 | 1/2017 | Chang et al. | |
| 9,773,892 B2 | 9/2017 | Ching et al. | |
| 2008/0121994 A1* | 5/2008 | Dyer ................. | H01L 29/66772 257/347 |

(Continued)

OTHER PUBLICATIONS

R.J. Mears et al., "Simultaneous carrier transport enhancement and variability reduction in Si MOSFETs by insertion of partial monolayers of oxygen", Silicon Nanoelectronics Workshop (SNW), 2012 IEEE.

*Primary Examiner* — Samuel A Gebremariam
(74) *Attorney, Agent, or Firm* — Lee IP Law, P.C.

(57) ABSTRACT

A semiconductor device includes at least one active pattern on a substrate, at least one gate electrode intersecting the at least one active pattern, source/drain regions on the at least one active pattern, the source/drain regions being on opposite sides of the at least one gate electrode, and a barrier layer between at least one of the source/drain regions and the at least one active pattern, the barrier layer being at least on bottoms of the source/drain regions and including oxygen.

21 Claims, 18 Drawing Sheets

(56) References Cited

U.S. PATENT DOCUMENTS

2012/0091469 A1* 4/2012 Park ................... H01L 29/0847
257/77
2015/0243756 A1* 8/2015 Obradovic .......... H01L 29/7848
438/285

* cited by examiner

SEMICONDUCTOR DEVICE AND METHOD OF FABRICATING THE SAME

CROSS-REFERENCE TO RELATED APPLICATIONS

Korean Patent Application No. 10-2018-0026923, filed on Mar. 7, 2018, in the Korean Intellectual Property Office, and entitled: "Semiconductor Device and Method of Fabricating the Same," is incorporated by reference herein in its entirety.

BACKGROUND

1. Field

The present disclosure relates to a semiconductor device and a method of fabricating the same, and in particular, to a semiconductor device including a field effect transistor and a method of fabricating the same.

2. Description of the Related Art

A semiconductor device may include an integrated circuit with metal-oxide-semiconductor field-effect transistors (MOS-FETs). To meet an increasing demand for a semiconductor device with a small pattern size and a reduced design rule, the MOS-FETs in the integrated circuit are scaled down. However, scaling down of the MOS-FETs may lead to deterioration in operation characteristics of the semiconductor device. Thus, a variety of studies are being conducted to overcome technical limitations associated with the scaling down of the semiconductor device and to realize high performance semiconductor devices.

SUMMARY

According to some embodiments, a semiconductor device may include at least one active pattern on a substrate, at least one gate electrode intersecting the at least one active pattern, source/drain regions on the at least one active pattern, the source/drain regions being on opposite sides of the at least one gate electrode, and a barrier layer between at least one of the source/drain regions and the at least one active pattern, the barrier layer being at least on bottoms of the source/drain regions and including oxygen.

According to some embodiments, a semiconductor device may include at least one active finFET pattern on a substrate, at least one gate electrode intersecting the at least one active finFET pattern, source/drain regions on the at least one finFET pattern, the source/drain regions being on opposite sides of the at least one gate electrode, and a barrier layer between each one of the source/drain regions and the at least one finFET pattern, the barrier layer being conformal along bottoms of the source/drain regions and including oxygen.

According to some embodiments, a semiconductor device may include at least one active pattern on a substrate, at least one gate electrode intersecting the at least one active pattern, source/drain regions on the at least one active pattern, the source/drain regions being on opposite sides of the at least one gate electrode, a first barrier layer between each one of the source/drain regions and the at least one active pattern, the first barrier layer being at least on bottoms of the source/drain regions and including oxygen, and a second barrier layer between a top surface of each one of the source/drain region and a corresponding first barrier layer, the first and second barrier layers being spaced apart from each other.

According to some embodiments, a semiconductor device may include active patterns on first and second regions of a substrate, gate electrodes intersecting the active patterns, source/drain regions on the active patterns, two source/drain regions of the source/drain regions being on respective opposite sides of each gate electrode of the gate electrodes, and a barrier layer between each one of the source/drain regions and the active patterns in the first region of the substrate, the barrier layer being at least on bottoms of the source/drain regions and including oxygen According to some embodiments, a method of manufacturing a semiconductor device may include forming at least one active pattern on a substrate, forming at least one gate electrode intersecting the at least one active pattern, forming recesses in the at least one active pattern, the recesses being on opposite sides of the at least one gate electrode, conformally forming a barrier layer in at least one of the recesses, such that the barrier layer includes oxygen, and forming source/drain regions on the barrier layer.

According to some embodiments, a method of manufacturing a semiconductor device may include forming at least one active pattern on a substrate, forming at least one gate electrode intersecting the at least one active pattern, forming source/drain regions on the at least one active pattern by an epitaxial growth process, the source/drain regions being on opposite sides of the at least one gate electrode, and forming a barrier layer between each one of the source/drain regions and the at least one active pattern, the barrier layer including oxygen.

According to some embodiments, a method of manufacturing a semiconductor device may include forming at least one active pattern on a substrate, forming at least one gate electrode intersecting the at least one active pattern, forming source/drain regions on the at least one active pattern, the source/drain regions being on opposite sides of the at least one gate electrode, forming a barrier layer between each one of the source/drain regions and the at least one active pattern, the barrier layer including oxygen, and performing a thermal treatment on the source/drain regions at a temperature of about 800° C. to 1300° C.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully hereinafter with reference to the accompanying drawings, in which example embodiments are shown.

Figure 1:
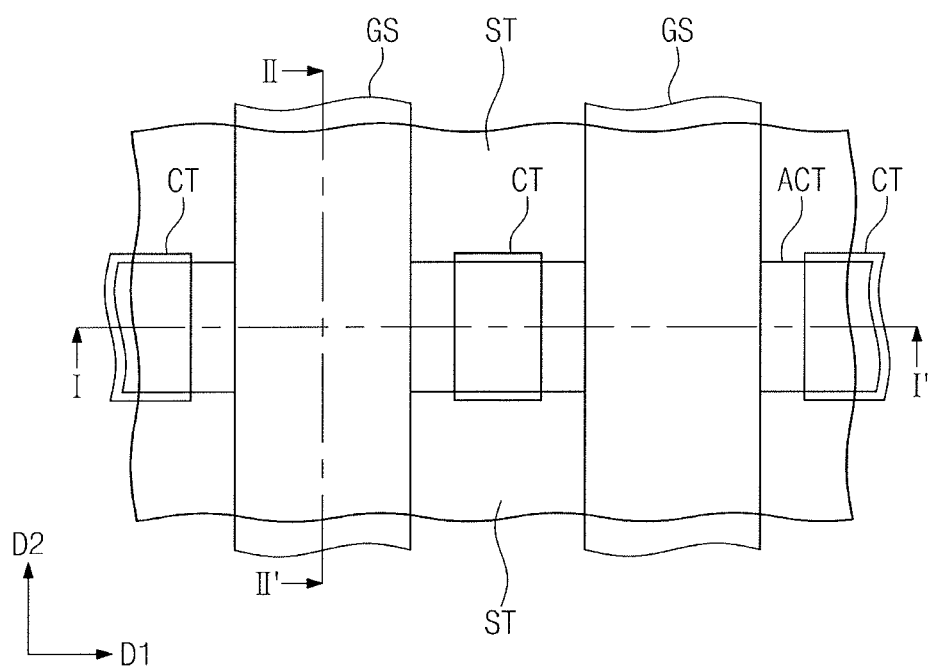
FIG. 1 illustrates a plan view of a semiconductor device according to embodiments.
Figure 2:
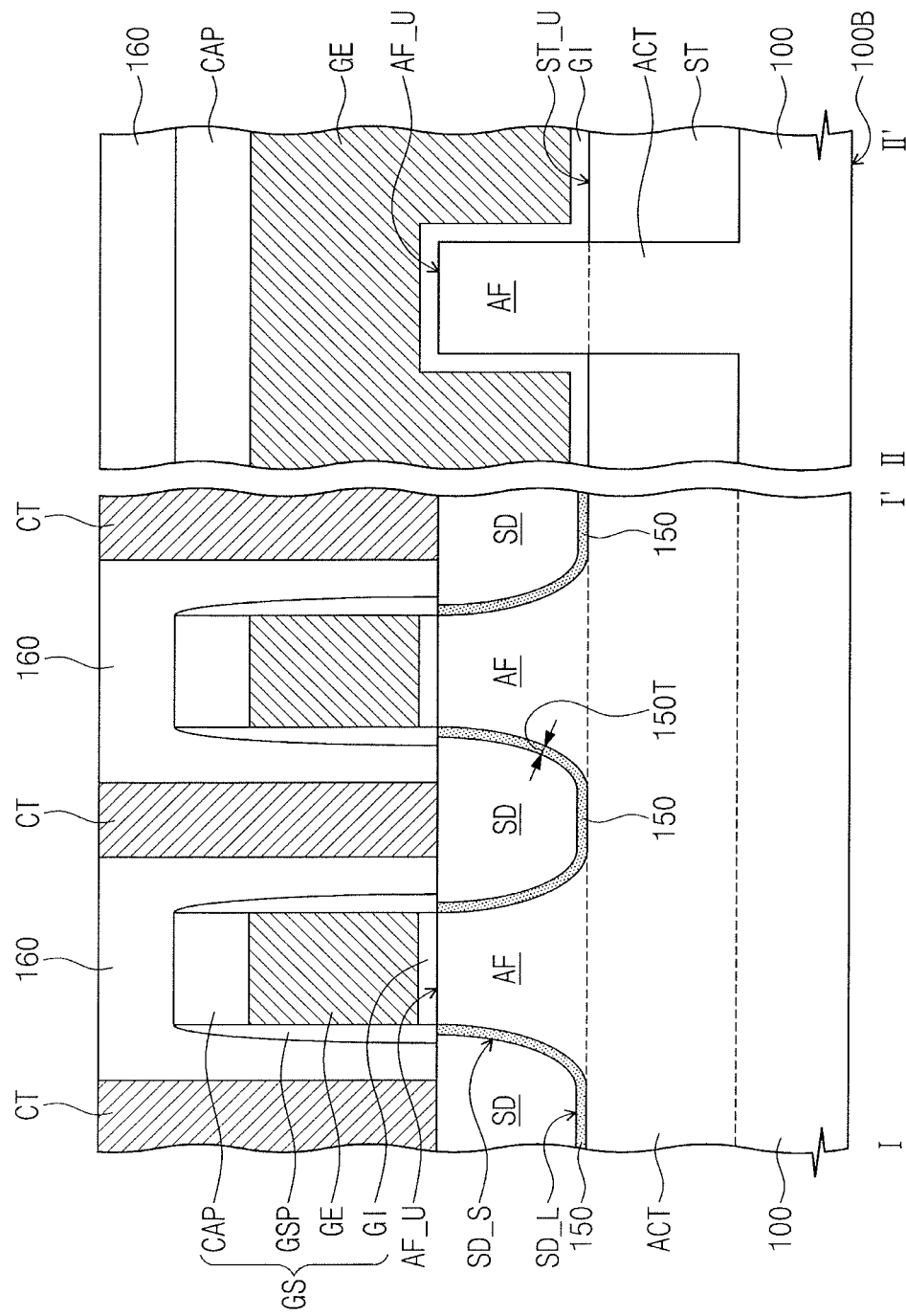
FIG. 2 illustrates a sectional view along lines I-I' and II-II' of FIG. 1.

FIG. 1 is a plan view illustrating a semiconductor device according to embodiments. FIG. 2 is a sectional view taken along lines I-I' and II-II' of FIG. 1.

Referring to FIGS. 1 and 2, an active pattern ACT, e.g., a fin field effect transistor (finFET) pattern, may be provided on a substrate 100. The active pattern ACT may be a protruding pattern that is extended from the substrate 100 in an upward direction normal to a bottom surface 100B of the substrate 100. The active pattern ACT may extend in a first direction D parallel to the bottom surface 100B of the substrate 100. The substrate 100 may be, e.g., a silicon substrate, a germanium substrate, or a silicon-on-insulator (SOI) substrate. The active pattern ACT may be formed of or include the same material as the substrate 100.

Device isolation patterns ST may be provided on the substrate 100 and at both sides of the active pattern ACT. The device isolation patterns ST may extend in the first direction D1 and may be spaced apart from each other in a second direction D2 crossing the first direction D1. The second direction D2 may be parallel to the bottom surface 100B of the substrate 100. The device isolation patterns ST may be spaced apart from each other in the second direction D2 with the active pattern ACT interposed therebetween. The device isolation patterns ST may be formed of or include at least one of, e.g., oxide, nitride, or oxynitride. The device isolation patterns ST may expose an upper portion of the active pattern ACT. The upper portion of the active pattern ACT exposed by the device isolation patterns ST may be referred to as "an active fin AF". In other words, the active fin AF may be a fin-shaped active region. A top surface ST_U of each of the device isolation patterns ST may be located at a height lower than that of an uppermost top surface AF_U of the active fin AF, where the height is measured from the bottom surface 100B on the substrate 100. The uppermost top surface AF_U of the active fin AF may correspond to an uppermost top surface of the active pattern ACT. The device isolation patterns ST may expose side surfaces of the active fin AF.

A gate structure GS may be provided on the substrate 100 to cross the active pattern ACT. The gate structure GS may extend in the second direction D2 and may cross the device isolation patterns ST. In some embodiments, a plurality of the gate structures GS may be provided to cross the active pattern ACT. In this case, the plurality of the gate structures GS may be spaced apart from each other in the first direction D1. Each of the gate structures GS may extend in the second direction D2 and may cross the device isolation patterns ST.

The gate structure GS may cover the uppermost top surface AF_U and the exposed side surfaces of the active fin AF. The gate structure GS may extend in the second direction D2 to cover the top surfaces ST_U of the device isolation patterns ST.

The gate structure GS may include a gate electrode GE covering the active fin AF, a gate dielectric pattern GI between the gate electrode GE and the active fin AF, a gate capping pattern CAP on a top surface of the gate electrode GE, and gate spacers GSP respectively provided on side surfaces of the gate electrode GE. The gate electrode GE may cross the active pattern ACT and the device isolation patterns ST. The gate dielectric pattern GI may extend along a bottom surface of the gate electrode GE. The gate dielectric pattern GI may be interposed between the gate electrode GE and the uppermost top surface AF_U of the active fin AF and between the gate electrode GE and the exposed side surfaces of the active fin AF, and may extend to be interposed between the gate electrode GE and the top surfaces ST_U of the device isolation patterns ST. The gate capping pattern CAP may extend along the top surface of the gate electrode GE in the second direction D2. Each of the gate spacers GSP may extend along a corresponding one of the side surfaces of the gate electrode GE in the second direction D2.

The gate electrode GE may include at least one conductive materials As an example, the gate electrode GE may include at least one of doped semiconductor materials, conductive metal nitride materials (e.g., titanium nitride, tantalum nitride, and so forth), or metallic materials (e.g., aluminum, tungsten, and so forth). The gate dielectric pattern GI may include at least one of high-k dielectric materials. As an example, the gate dielectric pattern GI may include at least one of hafnium oxide, hafnium silicate, zirconium oxide, or zirconium silicate. The gate capping pattern CAP and the gate spacers GSP may be formed of or include nitride (e.g., silicon nitride).

Source/drain patterns SD may be provided on the active pattern ACT at both sides of the gate structure GS. The active fin AF may be locally provided below the gate structure GS and may be interposed between the source/drain patterns SD. The source/drain patterns SD may be spaced apart from each other in a horizontal direction (e.g., in the first direction D1) with the active fin AF interposed therebetween. A lowermost bottom surface SD_L of each of the source/drain patterns SD may be located at a height lower than that of the uppermost top surface AF_U of the active fin AF, where the height is measured from the bottom surface 100B of the substrate 100. The gate structure GS and the source/drain patterns SD may constitute a transistor, and a portion of the active fin AF may be used as a channel region of the transistor.

Each of the source/drain patterns SD may be formed of or include a semiconductor pattern doped with impurities. In the case where the transistor is an NMOSFET, the source/drain patterns SD may be configured to exert a tensile strain on a channel region (i.e., the active fin AF) of the NMOSFET. In this case, the semiconductor pattern may be formed of or include silicon (Si) and/or silicon carbide (SiC). In the case where the transistor is a PMOSFET, the source/drain patterns SD may be configured to exert a compressive strain on a channel region (i.e., the active fin AF) of the PMOSFET. In this case, the semiconductor pattern may be formed of or include silicon germanium (SiGe). The impurities may be used to improve electric characteristics of the transistor. In the case where the transistor is an NMOSFET, the impurities may be n-type impurities (e.g., phosphorus (P)). In the case where the transistor is a PMOSFET, the impurities may be p-type impurities (e.g., boron (B)).

A barrier layer 150 may be interposed between each of the source/drain patterns SD and the active pattern ACT. The barrier layer 150 may be interposed between the lowermost bottom surface SD_L of each of the source/drain patterns SD and the active pattern ACT, and may be extended between a side surface SD_S of each of the source/drain patterns SD and the active fin AF. For example, the barrier layer 150 may cover an, e.g., entire, interface between the source/drain patterns SD and the active pattern ACT, e.g., the barrier layer 150 may extend continuously between the source/drain patterns SD and the active pattern ACT to completely separate therebetween and prevent diffusion of impurities therebetween. For example, the barrier layer 150 may have a "U"-shaped section. Each of the source/drain patterns SD may be spaced apart from the active pattern ACT and the active fin AF with the barrier layer 150 interposed therebetween.

The barrier layer 150 may include an oxygen-containing layer. For example, the barrier layer 150 may be configured to contain oxygen atoms. The barrier layer 150 may further contain the same element as that in the source/drain patterns SD. As an example, the barrier layer 150 may be formed of or include silicon oxide.

A thickness 150T of the barrier layer 150 may be smaller than a critical thickness, where the critical thickness is the largest thickness of the barrier layer 150 allowing for an epitaxial growth process of growing the semiconductor pattern of each of the source/drain patterns SD using the active pattern ACT and the active fin AF as a seed layer. In order words, the thickness 150T of the barrier layer 150 has to be a maximal thickness (or smaller) that allows an epitaxial growth therethrough, e.g., the thickness 150T has to be sufficiently small to allow an epitaxial growth of the source/drain patterns SD from the active fin AF through the barrier layer 150. For example, the thickness 150T may be uniform, and may be about 5 Angstroms or smaller, e.g., about 2 Angstroms to about 5 Angstroms. If the thickness 150T is more than 5 Angstroms, current passage through the barrier layer 150 may be poor, and epitaxial growth therethrough may be difficult to perform.

If impurities in the source/drain patterns SD were to diffuse into neighboring patterns by a subsequent thermal treatment process, e.g., if the impurities were to diffuse into the active pattern ACT and the active fin AF, electric characteristics of the transistor could have deteriorated. Therefore, according to embodiments, the barrier layer 150 may be interposed between each of the source/drain patterns SD and the active pattern ACT and between each of the source/drain patterns SD and the active fin AF to prevent such diffusion of impurities. That is, it is possible to suppress or prevent the impurities from being diffused from the source/drain patterns SD into the active pattern ACT and the active fin AF, thereby improving electric characteristics of the transistor.

An interlayered insulating layer 160 may be provided on the substrate 100 to cover the gate structure GS and the source/drain patterns SD. The interlayered insulating layer 160 may include at least one of, e.g., a silicon oxide layer, a silicon nitride layer, a silicon oxynitride layer, or low-k dielectric layers.

Conductive contacts CT may be provided in the interlayered insulating layer 160, and may be connected to the source/drain patterns SD, respectively. Each of the conductive contacts CT may be provided to penetrate through the interlayered insulating layer 160, and may be connected to a corresponding one of the source/drain patterns SD. The conductive contacts CT may be formed of or include at least one of conductive material including metals. A gate contact may be provided to penetrate a portion of the interlayered insulating layer 160 and may be connected to the gate electrode GE. Interconnection lines may be provided on the interlayered insulating layer 160 and may be connected to the conductive contacts CT and the gate contact. The gate contact and the interconnection lines may be formed of or include a conductive material (e.g., a metallic material). A source/drain voltage may be applied to the source/drain patterns SD via the conductive contacts CT and the interconnection lines connected thereto, and a gate voltage may be applied to the gate electrode GE via the gate contact and the interconnection lines connected thereto.

FIGS. 3 to 6 are sectional views along lines I-I' and II-II' of FIG. 1 that illustrate stages in a method of fabricating a semiconductor device according to some embodiments.

Figure 3:
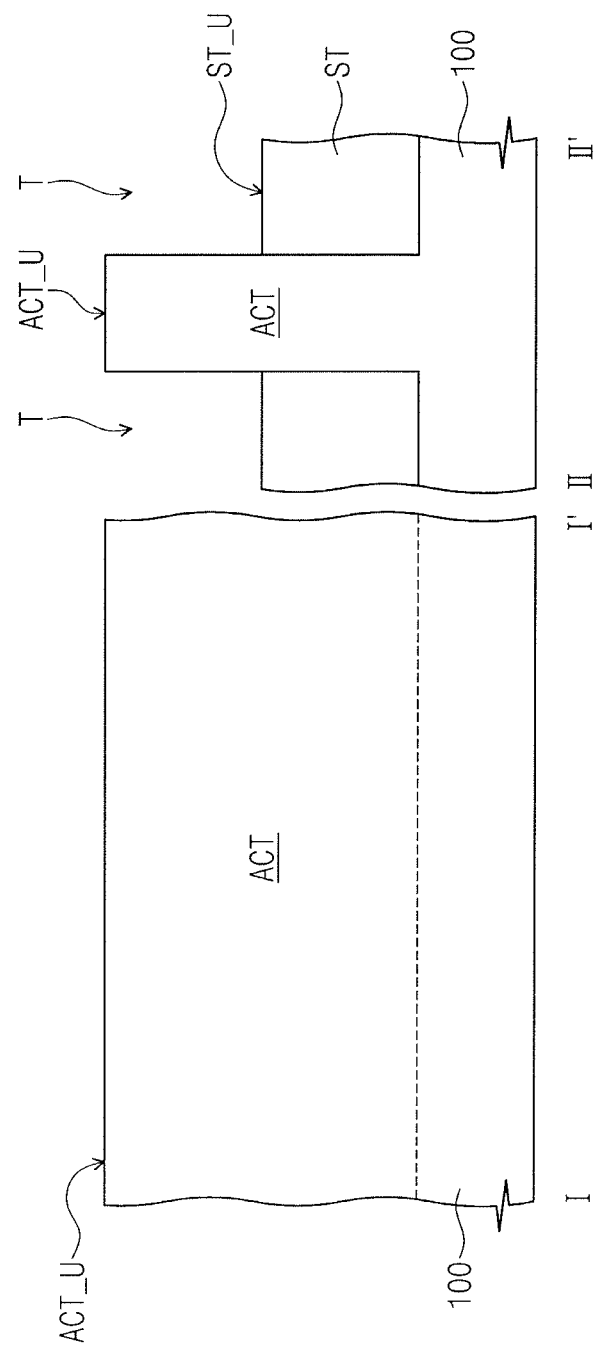
FIGS. 3 to 6 illustrate sectional views, along lines I-I' and II-II' of FIG. 1, of stages in a method of fabricating a semiconductor device according to embodiments.

Referring to FIGS. 1 and 3, an upper portion of the substrate 100 may be patterned to form trenches T defining the active pattern ACT. The active pattern ACT may extend in the first direction D1. Each of the trenches T may be a line-shaped pattern extending in the first direction D1. The trenches T may be spaced apart from each other in the second direction D2 with the active pattern ACT interposed therebetween. The formation of the trenches T may include forming a mask pattern on the substrate 100 to define a region, on which the active pattern ACT are to be formed, and then anisotropically etching the upper portion of the substrate 100 using the mask pattern as an etch mask.

The device isolation patterns ST may be respectively formed at both sides of the active pattern ACT. The device isolation patterns ST may be formed in the trenches T, respectively. The formation of the device isolation patterns ST may include forming an insulating layer on the substrate 100 to fill the trenches T and planarizing the insulating layer to expose the mask pattern. An upper portion of each of the device isolation patterns ST may be recessed to expose an upper portion of the active pattern ACT. Accordingly, the top surface ST_U of each of the device isolation patterns ST may be located at a height lower than the height of an uppermost top surface ACT_U of the active pattern ACT, where the height is measured from the bottom surface 100B of the substrate 100. The mask pattern may be removed when the upper portions of the device isolation patterns ST is recessed.

Figure 4:
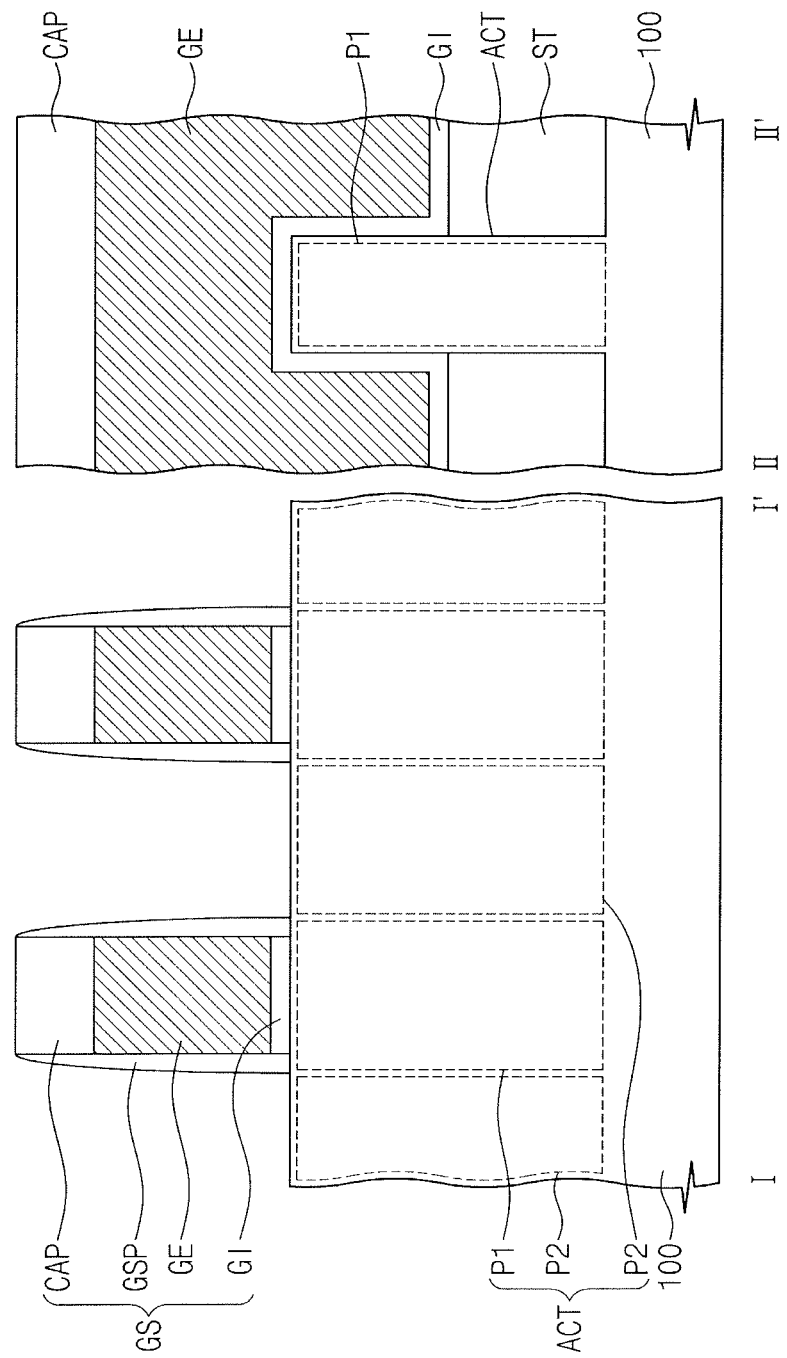

Referring to FIGS. 1 and 4, the gate structure GS may be formed on the substrate 100 to cross the active pattern ACT. The gate structure GS may be provided to extend in the second direction D2 and to cross the device isolation patterns ST. The gate structure GS may include the gate dielectric pattern GI, the gate electrode GE, and the gate capping pattern CAP, which are sequentially stacked on the substrate 100. The gate structure GS may further include the gate spacers GSP, which are respectively provided on the side surfaces of the gate electrode GE.

The formation of the gate structure GS may include forming a gate dielectric layer on the substrate 100 to cover the active pattern ACT and the device isolation patterns ST, forming a gate electrode layer on the gate dielectric layer, forming the gate capping pattern CAP on the gate electrode layer, and sequentially etching the gate electrode layer and the gate dielectric layer using the gate capping pattern CAP as an etch mask. The gate electrode GE and the gate dielectric pattern GI may be formed, as a result of the etching of the gate electrode layer and the gate dielectric layer. The formation of the gate structure GS may further include forming a spacer layer on the substrate 100 to conformally cover the gate dielectric pattern GI, the gate electrode GE, and the gate capping pattern CAP, and anisotropically etching the spacer layer to form the gate spacers GSP.

Since the gate structure GS is formed to cross the active pattern ACT, the active pattern ACT may include a first portion P1 and second portions P2. The first portion P1 may be a portion of the active pattern ACT, which is located below the gate structure GS and is overlapped with the gate structure GS, when viewed in a plan view. The second portions P2 may be other portions of the active pattern ACT, which are located at both sides of the gate structure GS when viewed in a plan view.

Figure 5:
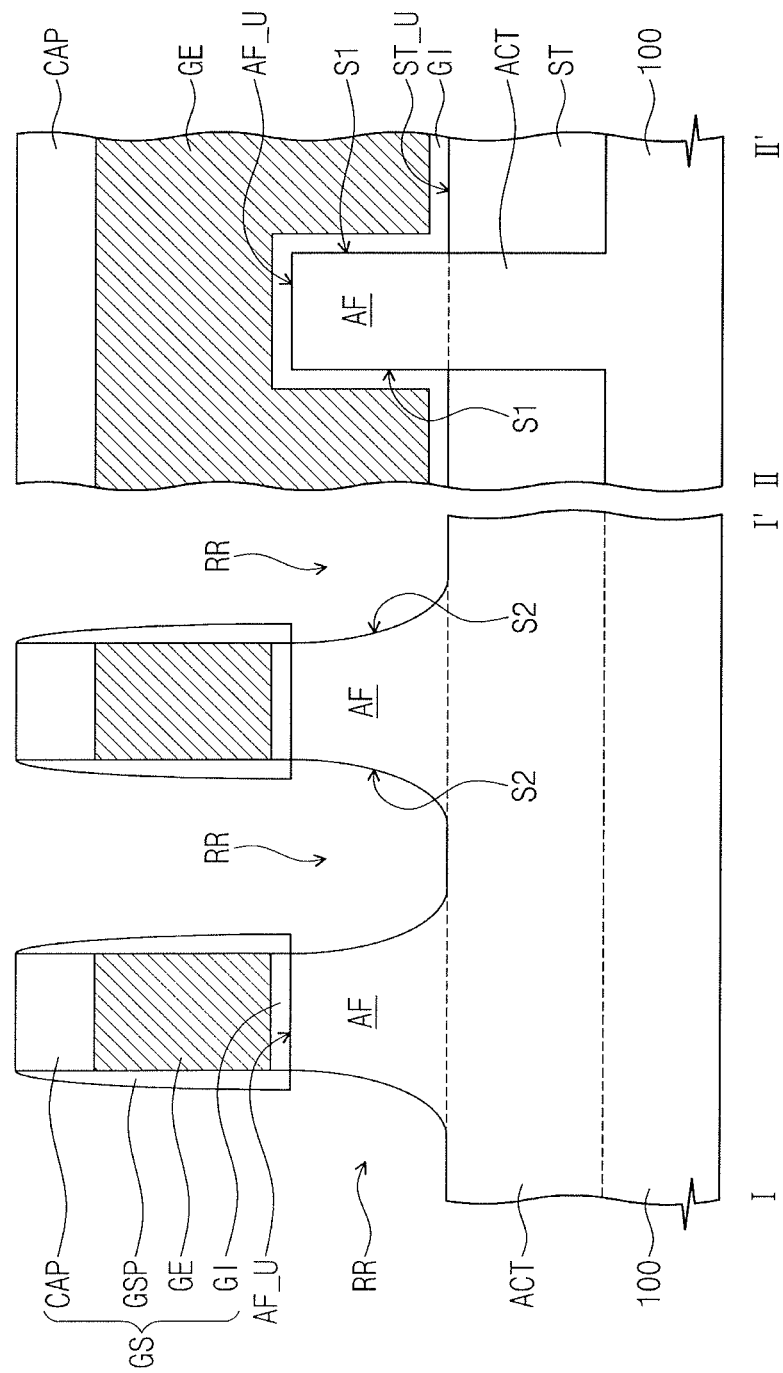

Referring to FIGS. 1 and 5, upper portions of the second portions P2 of the active pattern ACT may be recessed to form recess regions RR, respectively. An upper portion (e.g., the active fin AF) of the first portion P1 of the active pattern ACT may have first side surfaces S1, which are respectively exposed by the device isolation patterns ST, and second side surfaces S2, which are respectively exposed by the recess regions RR. The uppermost top surface AF_U of the active fin AF may correspond to the uppermost top surface ACT_U of the active pattern ACT. The gate structure GS may cover the uppermost top surface AF_U and the first side surfaces S1 of the active fin AF.

The formation of the recess regions RR may include performing a dry or wet etching process to etch the upper portions of the second portions P2 of the active pattern ACT. In some embodiments, the recess regions RR may be extended below the gate spacers GSP.

Figure 6:
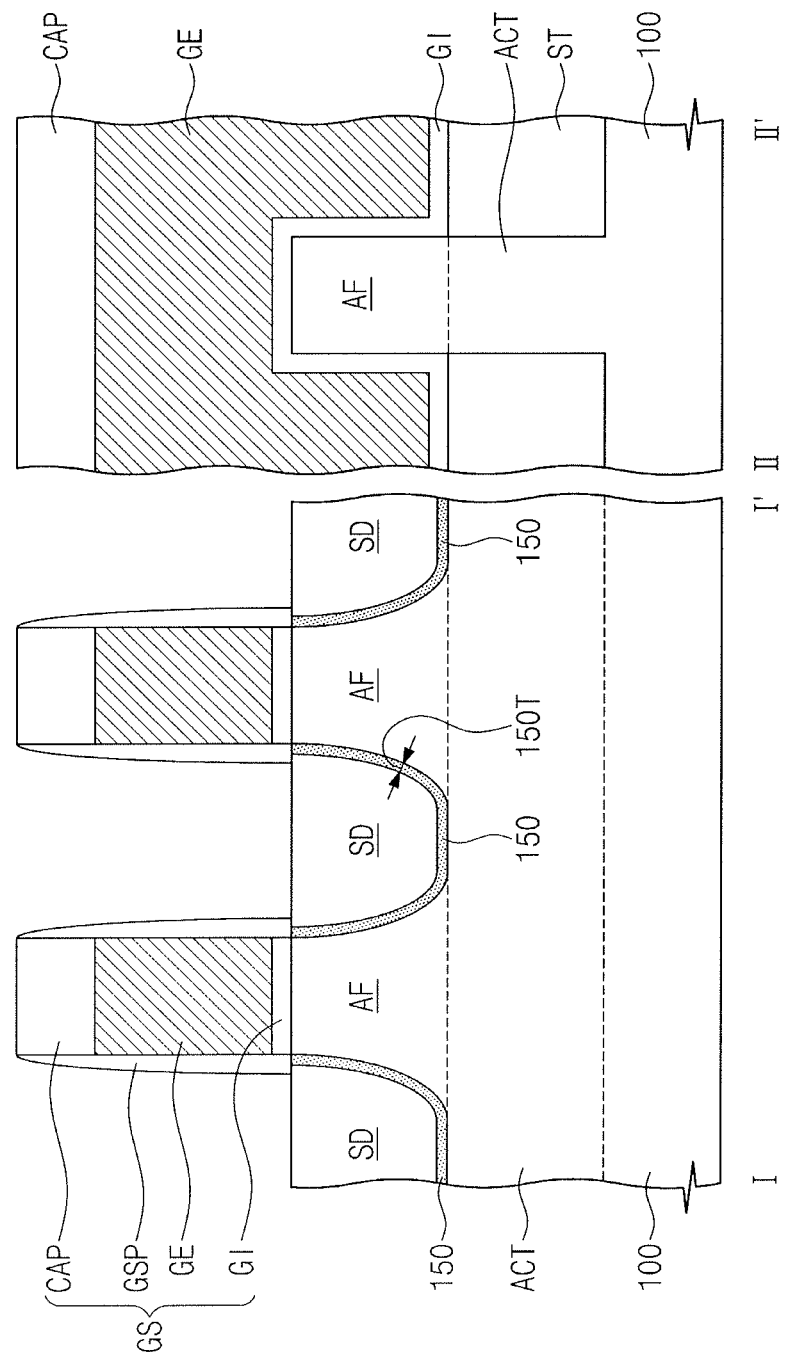

Referring to FIGS. 1 and 6, the source/drain patterns SD may be formed on the active pattern ACT at both sides of the gate structure GS. The source/drain patterns SD may be formed in the recess regions RR, respectively. The barrier layer 150 may be formed to be interposed between each of the source/drain patterns SD and the active pattern ACT and to extend between each of the source/drain patterns SD and the active fin AF.

The barrier layer 150 may be formed in each of the recess regions RR. The barrier layer 150 may be provided to fill a portion of each of the recess regions RR, and each of the source/drain patterns SD may be provided to fill a remaining portion of each of the recess regions RR. The barrier layer 150 may be formed to conformally cover an, e.g., entire, inner surface of each of the recess regions RR. Each of the source/drain patterns SD may be spaced apart from the active pattern ACT and the active fin AF with the barrier layer 150 interposed therebetween.

For example, the barrier layer 150 may be deposited in the recess regions RR on the active pattern ACT at both sides of the gate structure GS to have the thickness 150T, e.g., the barrier layer 150 may be deposited by an atomic layer deposition (ALD) to control the thickness 150T to be 5 Angstroms or less. Once formation of the barrier layer 150 is complete, the source/drain patterns SD may be formed by a selective epitaxial growth through the barrier layer 150 by using the active pattern ACT and the active fin AF as a seed layer to form a semiconductor pattern. Since the thickness 150T of the barrier layer 150 is sufficiently small, i.e., 5 Angstroms or less, epitaxial growth of the source/drain patterns SD may be performed through the barrier layer 150.

In another example, the barrier layer 150 may be formed during formation of, e.g., simultaneously with, the source/drain patterns SD by an epitaxial motion method. That is, the source/drain patterns SD may be formed by a selective epitaxial growth process using the active pattern ACT and the active fin AF as a seed layer to form a semiconductor pattern. Formation of the barrier layer 150 may include injecting oxygen atoms during the selective epitaxial growth of the source/drain patterns SD until the barrier layer 150 reaches the thickness 150T.

The semiconductor pattern of the source/drain patterns SD, formed either after or during formation of the barrier layer 150, may be doped with impurities. Doping of the semiconductor pattern may be performed during or after the selective epitaxial growth process, e.g., doping may be performed only after formation of the barrier layer 150 is complete.

The semiconductor pattern may include, e.g., silicon (Si), silicon carbide (SiC), and/or silicon germanium (SiGe), and the impurities may be n-type impurities (e.g., phosphorus (P)) or p-type impurities (e.g., boron (B)). The barrier layer 150 may include an oxygen-containing layer. For example, as discussed previously, the formation of the barrier layer 150 may include injecting oxygen atoms during the selective epitaxial growth process.

As discussed previously, the thickness 150T of the barrier layer 150 may be smaller than a critical thickness, where the critical thickness is the largest thickness of the barrier layer 150 allowing for an epitaxial growth process of growing the semiconductor pattern using the active pattern ACT and the active fin AF as a seed layer. In the case where the thickness 150T of the barrier layer 150 is greater than the critical thickness, it may be difficult to use the active pattern ACT and the active fin AF as a seed layer in the epitaxial growth process of the semiconductor pattern. The barrier layer 150 may further contain the same element as that in the source/drain patterns SD. As an example, the source/drain patterns SD may include silicon, and the barrier layer 150 may be formed of or include silicon oxide.

Next, a thermal treatment process, e.g., annealing, may be performed on the substrate 100, after the formation of the source/drain patterns SD. The thermal treatment process may be performed to activate the impurities in the source/drain patterns SD. The thermal treatment process may be performed at a relatively high temperature. For example, the thermal treatment process may include a spike rapid thermal annealing (sRTA) process, which is performed at a temperature of about 800° C.-1200° C. and/or a laser spike annealing (LSA) process, which is performed at a temperature of about 1100° C.-1300° C.

According to embodiments, the barrier layer 150 may suppress or prevent the impurities in the source/drain patterns SD from being diffused into other patterns adjacent thereto despite the high temperature of the thermal treatment process. In other words, the thermal treatment process according to embodiments may be performed at a relatively high temperature. e.g., as compared to other thermal treatments, thereby increasing an extent of activation of the impurities in the source/drain patterns SD. When the extent of activation of the impurities in the source/drain patterns SD is increased, electric resistance of the source/drain patterns SD may be lowered. Accordingly, it may be possible to improve electric characteristics of the transistor including the source/drain patterns SD.

Referring back to FIGS. 1 and 2, the interlayered insulating layer 160 may be formed on the substrate 100, on which the source/drain patterns SD and the barrier layer 150 are provided. The interlayered insulating layer 160 may be formed to cover the gate structure GS and the source/drain patterns SD. The interlayered insulating layer 160 may include at least one of, e.g., a silicon oxide layer, a silicon nitride layer, a silicon oxynitride layer, or low-k dielectric layers. The conductive contacts CT may be formed in the interlayered insulating layer 160 and may be connected to the source/drain patterns SD, respectively. The formation of the conductive contacts CT may include forming contact holes to penetrate the interlayered insulating layer 160 and to expose the source/drain patterns SD, respectively, and forming the conductive contacts CT in the contact holes, respectively. The gate contact may be formed in the interlayered insulating layer 160 and may be connected to the gate electrode GE. The formation of the gate contact may include forming a gate contact hole to penetrate a portion of the interlayered insulating layer 160 and to expose the gate electrode GE and forming the gate contact in the gate contact hole. The interconnection lines may be formed on the interlayered insulating layer 160 and may be connected to the conductive contacts CT and the gate contact. The interconnection lines may be used to apply various voltages to the source/drain patterns SD and the gate electrode GE through the conductive contacts CT and the gate contact.

Figure 7:
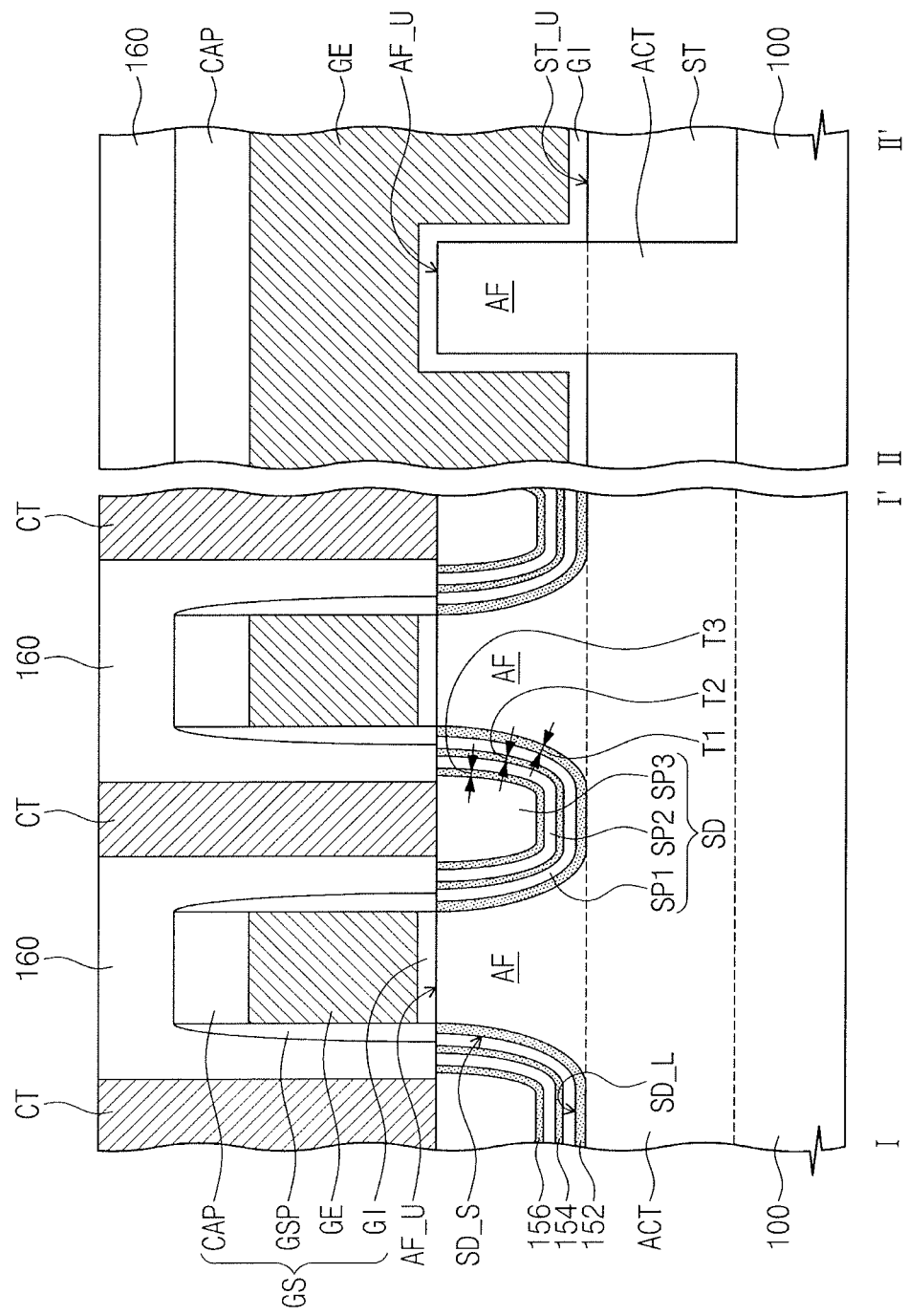
FIG. 7 illustrates a sectional view, along lines I-I' and II-II' of FIG. 1, of a semiconductor device according to embodiments.

FIG. 7 is a sectional view along lines I-I' and II-II' of FIG. 1 to illustrate a semiconductor device according to some embodiments. For concise description, an element previously described with reference to FIGS. 1 and 2 may be identified by the same reference number without repeating an overlapping description thereof.

Referring to FIGS. 1 and 7, the source/drain patterns SD may be provided on the active pattern ACT at both sides of the gate structure GS. The active fin AF may be locally provided below the gate structure GS and may be interposed between the source/drain patterns SD. The source/drain patterns SD may be spaced apart from each other in a horizontal direction (e.g., in the first direction D1) with the active fin AF interposed therebetween. The lowermost bottom surface SD_L of each of the source/drain patterns SD may be located at a height lower than that of the uppermost top surface AF_U of the active fin AF, where the height is measured from the substrate 100. The gate structure GS and the source/drain patterns SD may constitute a transistor, and a portion of the active fin AF may be used as a channel region of the transistor.

Each of the source/drain patterns SD may include a first semiconductor pattern SP1, a second semiconductor pattern SP2, and a third semiconductor pattern SP3, which are sequentially stacked on the active pattern ACT. The first semiconductor pattern SP1 may be interposed between the second semiconductor pattern SP2 and the active pattern ACT, and may extend between the second semiconductor pattern SP2 and the active fin AF. The second semiconductor pattern SP2 may be spaced apart from the active pattern ACT and the active fin AF with the first semiconductor pattern SP1 interposed therebetween. The second semiconductor pattern SP2 may be interposed between the third semiconductor pattern SP3 and the active pattern ACT, and may extend between the third semiconductor pattern SP3 and the active fin AF. The third semiconductor pattern SP3 may be spaced apart from the active pattern ACT and the active fin AF with the first and second semiconductor patterns SP1 and SP2 interposed therebetween.

The first semiconductor pattern SP1 may include a material having a lattice constant that is different from a lattice constant of the second semiconductor pattern SP2. In some embodiments, the first semiconductor pattern SP1 may include a material having a lattice constant that is different from lattice constants of the second and third semiconductor patterns SP2 and SP3. The second semiconductor pattern SP2 may include a material having a lattice constant that is different from a lattice constant of the third semiconductor pattern SP3. Each of the first to third semiconductor patterns SP1, SP2, and SP3 may contain impurities. A concentration of the impurities in the first semiconductor pattern SP may be different from a concentration of the impurities in the second semiconductor pattern SP2. In some embodiments, the concentration of the impurities in the first semiconductor pattern SP may be different from the concentration of the impurities in each of the second and third semiconductor patterns SP2 and SP3. The concentration of the impurities in the second semiconductor pattern SP2 may be different from the concentration of the impurities in the third semiconductor pattern SP3.

In the case where the transistor including the gate structure GS and the source/drain patterns SD is an NMOSFET, the source/drain patterns SD may be configured to exert a tensile strain on a channel region (i.e., the active fin AF) of the NMOSFET. In this case, each of the first to third semiconductor patterns SP1, SP2, and SP3 may be formed of or include silicon (Si) and/or silicon carbide (SiC). In the case where the transistor is a PMOSFET, the source/drain patterns SD may be configured to exert a compressive strain on a channel region (i.e., the active fin AF) of the PMOSFET. In this case, each of the first to third semiconductor patterns SP1, SP2, and SP3 may be formed of or include silicon (Si) and/or silicon germanium (SiGe). The impurities may be used to improve electric characteristics of the transistor. In the case where the transistor is an NMOSFET, the impurities may be n-type impurities (e.g., phosphorus (P)). In the case where the transistor is a PMOSFET, the impurities may be p-type impurities (e.g., boron (B)).

A first barrier layer 152 may be interposed between each of the source/drain patterns SD and the active pattern ACT. The first barrier layer 152 may be interposed between the lowermost bottom surface SD_L of each of the source/drain patterns SD and the active pattern ACT, and may extend between the side surface SD_S of each of the source/drain patterns SD and the active fin AF. For example, the first barrier layer 152 may cover an, e.g., entire, interface between the source/drain patterns SD and the active pattern ACT, e.g., the first barrier layer 152 may extend continuously between the source/drain patterns SD and the active pattern ACT to completely separate therebetween and prevent diffusion of impurities therebetween. For example, the first barrier layer 152 may conformal along the lowermost bottom surface SD_L and side surface SD_S of each of the source/drain patterns SD, e.g., to have a "U"-shaped cross-section. For example, the first barrier layer 152 may be substantially the same as the barrier layer 150 in FIG. 2.

The lowermost bottom surface SD_L of each of the source/drain patterns SD may correspond to the lowermost bottom surface of the first semiconductor pattern SP1, and the side surface SD_S of each of the source/drain patterns SD may correspond to the side surface of the first semiconductor pattern SP1. Each of the source/drain patterns SD may be spaced apart from the active pattern ACT and the active fin AF with the first barrier layer 152 interposed therebetween. The first barrier layer 152 may be interposed between the first semiconductor pattern SP1 and the active pattern ACT, and may extend between the first semiconductor pattern SP1 and the active fin AF. The first semiconductor pattern SP1 may be spaced apart from the active pattern ACT and the active fin AF with the first barrier layer 152 interposed therebetween.

A second barrier layer 154 may be interposed between the first and second semiconductor patterns SP1 and SP2. The second barrier layer 154 may be interposed between the second semiconductor pattern SP2 and the active pattern ACT, and may extend between the second semiconductor pattern SP2 and the active fin AF. For example, the second barrier layer 154 may extend, e.g., continuously, along an, e.g., entire, boundary between the first and second semiconductor patterns SP1 and SP2. e.g., to have a "U"-shaped cross-section. The first semiconductor pattern SP1 and the second semiconductor pattern SP2 may be spaced apart from each other with the second barrier layer 154 interposed therebetween.

A third barrier layer 156 may be interposed between the second and third semiconductor patterns SP2 and SP3. The third barrier layer 156 may be interposed between the third semiconductor pattern SP3 and the active pattern ACT, and may extend between the third semiconductor pattern SP3 and the active fin AF. For example, the second barrier layer 154 may extend, e.g., continuously, along an, e.g., entire, boundary between the first and second semiconductor patterns SP and SP2, e.g., to have a "U"-shaped cross-section. The second and third semiconductor patterns SP2 and SP3 may be spaced apart from each other with the third barrier layer 156 interposed therebetween.

Each of the first to third barrier layers 152, 154, and 156 may include an oxygen-containing layer. For example, each of the first to third barrier layers 152, 154, and 156 may be provided to contain oxygen atoms. Each of the first to third barrier layers 152, 154, and 156 may further contain the same element as that in the source/drain patterns SD. As an example, each of the first to third barrier layers 152, 154, and 156 may be formed of or include silicon oxide. The first to third barrier layers 152, 154, and 156 may be provided to have thicknesses T1, T2, and T3, each of which is smaller than a critical thickness, where the critical thickness is the largest thickness of a corresponding one of the first to third barrier layers 152, 154, and 156, allowing for an epitaxial growth process of growing the first to third semiconductor patterns SP1, SP2, and SP3 using the active pattern ACT and the active fin AF as a seed layer. For example, each of the thicknesses T1, T2, and T3 may be equal to the thickness 150T in FIG. 2, e.g., about 2 Angstroms to about 5 Angstroms. For example, the thicknesses T1, T2, and T3 may be equal to each other or different from each other, as long as they do not exceed a thickness of about 5 Angstroms. For example, the first to third barrier layers 152, 154, and 156 may have a substantially same shape, while the shape is having a decreased size and being spaced apart from an each other.

In the present embodiments, the first barrier layer 152 may be interposed between the first semiconductor pattern SP1 and the active pattern ACT, and between the first semiconductor pattern SP1 and the active fin AF. In addition, the second barrier layer 154 and the third barrier layer 156 may be respectively interposed between the first and second semiconductor patterns SP and SP2, and between the second and third semiconductor patterns SP2 and SP3. Accordingly, it may be possible to suppress or prevent the impurities from being diffused from the source/drain patterns SD into the active pattern ACT and the active fin AF or to suppress or prevent an impurity inter-diffusion between the first to third semiconductor patterns SP1, SP2, and SP3. Accordingly, electric characteristics of the transistor may be improved.

Except for the described differences above, the semiconductor device in FIG. 7 has substantially the same features as those of the semiconductor device previously described with reference to FIGS. 1 and 2.

Figure 8:
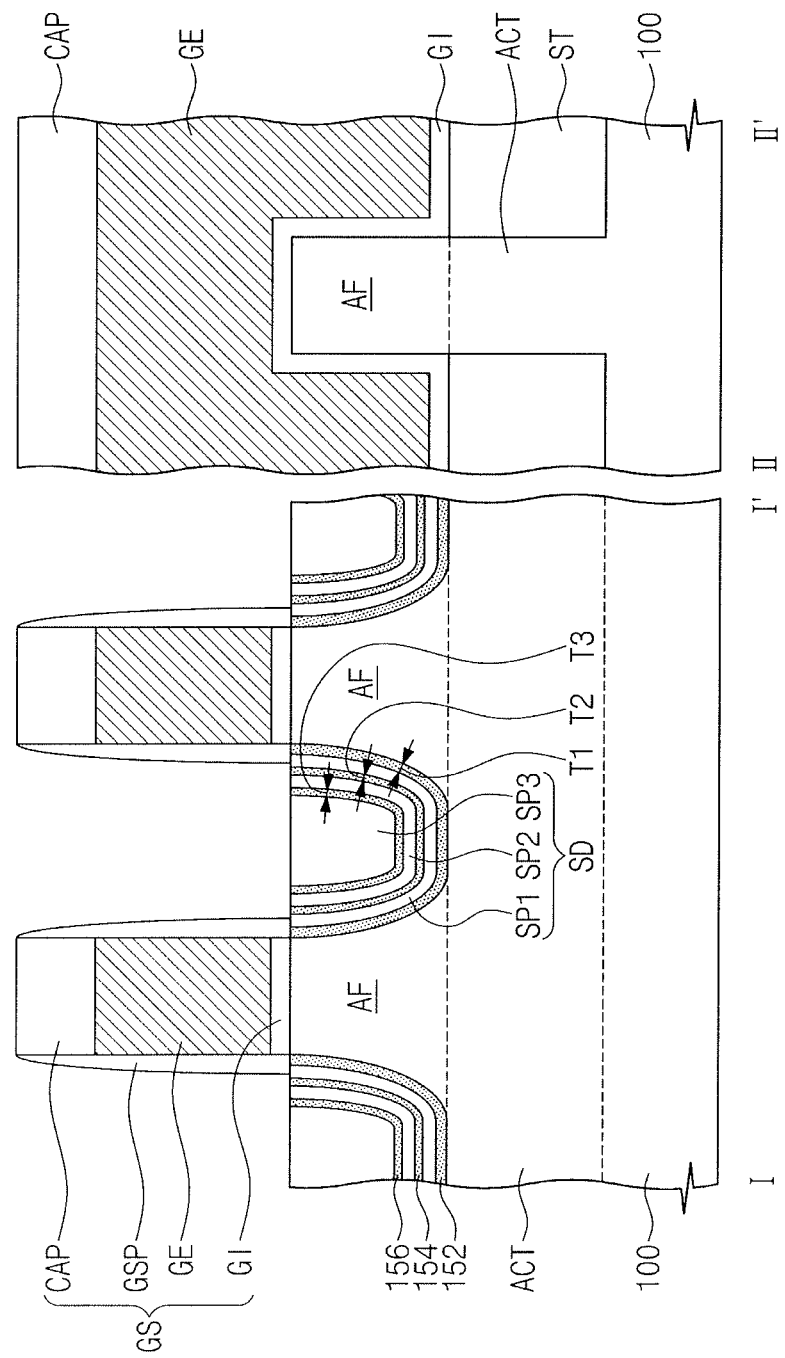
FIG. 8 illustrates a sectional view, along lines I-I' and II-II' of FIG. 1, of a stage in a method of fabricating a semiconductor device according to embodiments.

FIG. 8 is a sectional view along lines I-I' and II-II' of FIG. 1 to illustrate a method of fabricating a semiconductor device, according to some embodiments. For concise description, an element or step previously described with reference to FIGS. 1 to 6 may be identified by the same reference number without repeating an overlapping description thereof.

Referring to FIGS. 1 and 8, the source/drain patterns SD may be formed on the active pattern ACT at both sides of the gate structure GS. The source/drain patterns SD may be formed in the recess regions RR, respectively, which were previously described with reference to FIG. 6. The formation of the source/drain patterns SD may include performing a selective epitaxial growth process, which uses the active pattern ACT and the active fin AF as a seed layer to sequentially form the first, second, and third semiconductor patterns SP1, SP2, and SP3. Each of the first to third semiconductor patterns SP1. SP2, and SP3 may be doped with impurities during or after the selective epitaxial growth process.

The first to third semiconductor patterns SP1, SP2, and SP3 may be formed to sequentially cover an inner surface of each of the recess regions RR. Each of the first to third semiconductor patterns SP1, SP2, and SP3 may contain, for example, silicon (Si), silicon carbide (SiC), and/or silicon germanium (SiGe), and the impurities may be n-type impurities (e.g., phosphorus (P)) or p-type impurities (e.g., boron (B)).

The first barrier layer 152 may be interposed between each of the source/drain patterns SD and the active pattern ACT, and may extend between each of the source/drain patterns SD and the active fin AF. That is, the first barrier layer 152 may be formed in each of the recess regions RR to conformally cover an inner surface of each of the recess regions RR. Each of the first semiconductor patterns SP1 may be spaced apart from the active pattern ACT and the active fin AF with the first barrier layer 152 interposed therebetween. For example, the first barrier layer 152 may be an oxygen-containing layer.

For example, as discussed previously with reference to the barrier layer 150 in FIG. 6, the first barrier layer 152 may be formed by injecting oxygen atoms during the selective epitaxial growth process of the first semiconductor patterns SP1. In another example, as discussed previously with reference to the barrier layer 150 in FIG. 6, the first barrier layer 152 may be formed by a separate deposition process, which is performed before the selective epitaxial growth process of the first semiconductor patterns SP1. In either method of forming the first barrier layer 152, the formation of the first barrier layer 152 is controlled to have the first thickness T1 sufficiently thin, so the first semiconductor patterns SP1 may be epitaxially grown from the active pattern ACT and the active fin AF through the first barrier layer 152.

The second barrier layer 154 and third barrier layer 156 may be interposed between the first and second semiconductor patterns SP1 and SP2, and between the second and third semiconductor patterns SP2 and SP3, respectively. The first and second semiconductor patterns SP1 and SP2 may be spaced apart from each other with the second barrier layer 154 interposed therebetween, and the second and third semiconductor patterns SP2 and SP3 may be spaced apart from each other with the third barrier layer 156 interposed therebetween. Each of the second and third barrier layers 154 and 156 may be an oxygen-containing layer. The formation of each of the second and third barrier layers 154 and 156 may be performed in the same way as that of the first barrier layer 152, e.g., injecting oxygen atoms during the selective epitaxial growth process or a separate deposition process before the selective epitaxial growth process.

The first to third barrier layers 152, 154, and 156 may be provided to have thicknesses T1, T2, and T3, each of which is smaller than a critical thickness, where the critical thickness is the largest thickness of a corresponding one of the first to third barrier layers 152, 154, and 156, allowing for an epitaxial growth process of growing the first to third semiconductor patterns SP1, SP2, and SP3 using the active pattern ACT and the active fin AF as a seed layer. In the case where each of the thicknesses T1, T2, and T3 of the first to third barrier layers 152, 154, and 156, respectively, is greater than the critical thickness, it may be difficult to use the active pattern ACT and the active fin AF as a seed layer in the epitaxial growth process of the first to third semiconductor patterns SP1, SP2, and SP3. Each of the first to third barrier layers 152, 154, and 156 may further contain the same element as that in the source/drain patterns SD. As an example, each of the first to third barrier layers 152, 154, and 156 may be formed of or include silicon oxide.

Next, a thermal treatment process may be performed on the substrate 100, after the formation of the source/drain patterns SD. The thermal treatment process may be performed to activate the impurities in the source/drain patterns SD. The thermal treatment process may be performed at a relatively high temperature, as described with reference to FIGS. 1 and 6.

According to some embodiments, the first to third barrier layers 152, 154, and 156 may suppress or prevent the impurities in the source/drain patterns SD from being diffused into other patterns adjacent thereto or may suppress or prevent an impurity inter-diffusion between the first to third semiconductor patterns SP1, SP2, and SP3. In this case, the thermal treatment process may be performed at a relatively high temperature, and this may make it possible to increase an extent of activation of the impurities in the source/drain patterns SD. Accordingly, it may be possible to reduce electric resistance of the source/drain patterns SD and to improve electric characteristics of the transistor including the source/drain patterns SD.

Except for the described differences above, the method of fabricating a semiconductor device according to the present embodiments may be performed in substantially the same manner as that previously described with reference to FIGS. 1 to 6.

Figure 9:
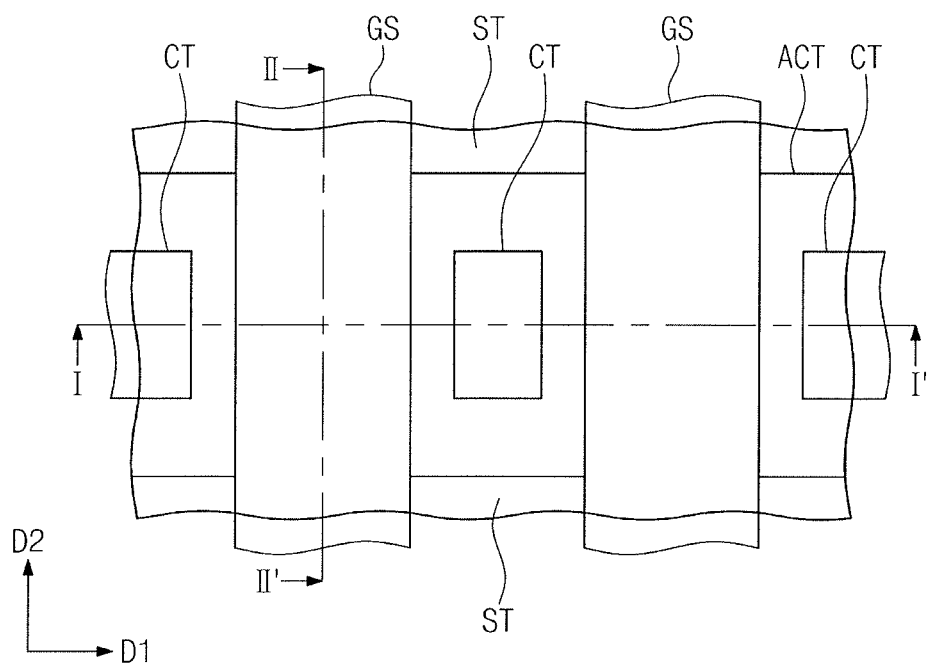
FIG. 9 illustrates a plan view of a semiconductor device according to embodiments.
Figure 10:
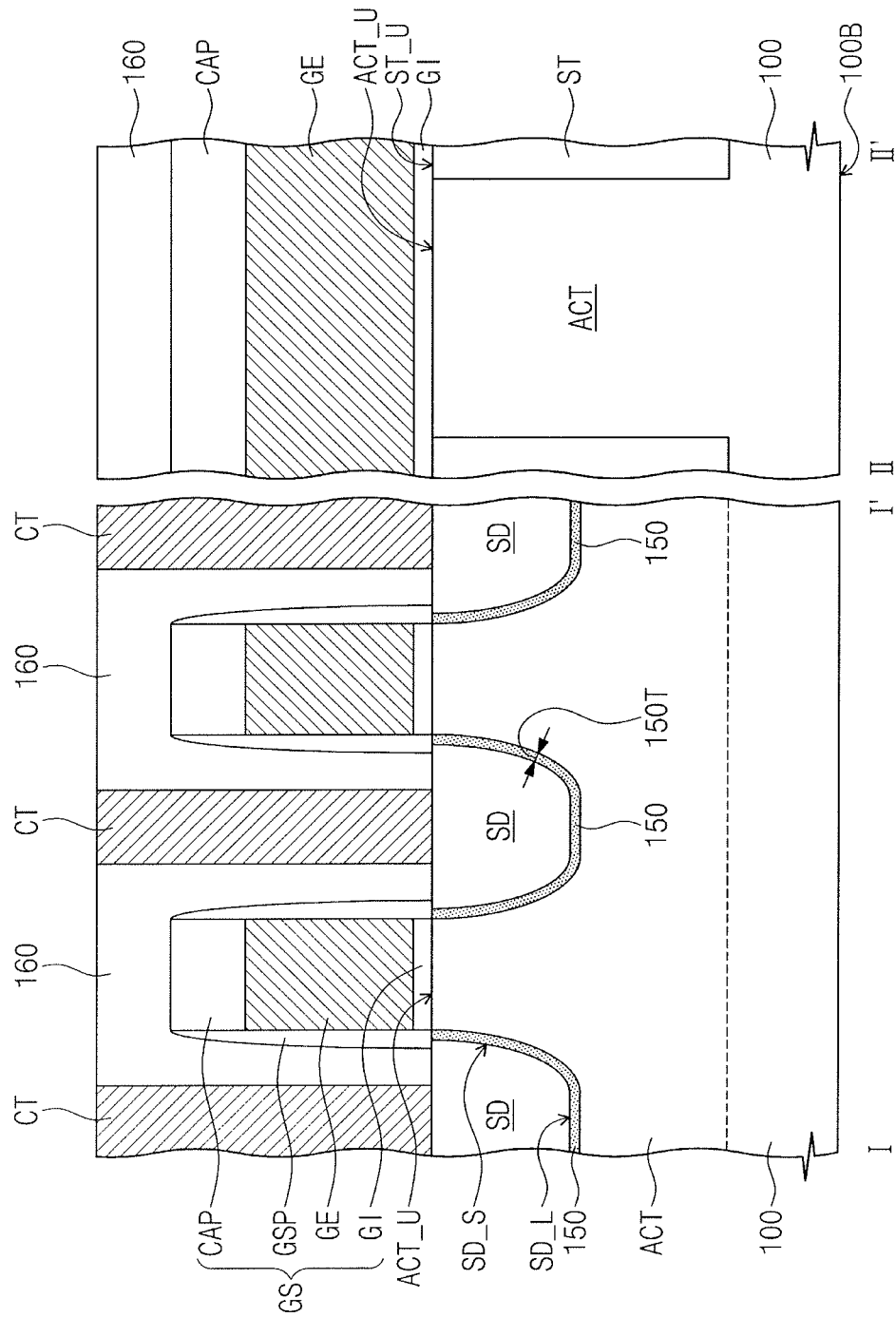
FIG. 10 illustrates a sectional view along lines I-I' and II-II' of FIG. 9.

FIG. 9 is a plan view illustrating a semiconductor device according to some embodiments. FIG. 10 is a sectional view along lines I-I' and II-II' of FIG. 9. For concise description, an element previously described with reference to FIGS. 1 and 2 may be identified by the same reference number without repeating an overlapping description thereof.

Referring to FIGS. 9 and 10, the active pattern ACT may be provided on the substrate 100. The active pattern ACT may be a protruding pattern that is extended from the substrate 100 in the upward direction normal to the bottom surface 100B of the substrate 100. The active pattern ACT may extend in the first direction D1 parallel to the bottom surface 100B of the substrate 100. The device isolation patterns ST may be provided on the substrate 100 and at both sides of the active pattern ACT. The device isolation patterns ST may extend in the first direction D1 and may be spaced apart from each other in the second direction D2 crossing the first direction D1. The second direction D2 may be parallel to the bottom surface 100B of the substrate 100. The device isolation patterns ST may be spaced apart from each other in the second direction D2 with the active pattern ACT interposed therebetween. In the present embodiments, the top surface ST_U of each of the device isolation patterns ST may be substantially coplanar with the uppermost top surface ACT_U of the active pattern ACT. For example, the top surface ST_U of each of the device isolation patterns ST may be located at substantially the same height as that of the uppermost top surface ACT_U of the active pattern ACT, when measured from the substrate 100.

The gate structure GS may be provided to cross the active pattern ACT and the device isolation patterns ST. The gate structure GS may cover the uppermost top surface ACT_U of the active pattern ACT and the top surface ST_U of each of the device isolation patterns ST.

The gate structure GS may include the gate electrode GE, which is provided to cross the active pattern ACT and the device isolation patterns ST, the gate dielectric pattern GI, which is provided between the gate electrode GE and the active pattern ACT, the gate capping pattern CAP, which is provided on the top surface of the gate electrode GE, and the gate spacers GSP, which are respectively provided on side surfaces of the gate electrode GE. The gate electrode GE may extend in the second direction D2 to cover the uppermost top surface ACT_U of the active pattern ACT and the top surfaces ST_U of the device isolation patterns ST. The gate dielectric pattern GI may be interposed between the gate electrode GE and the uppermost top surface ACT_U of the active pattern ACT and may extend between the gate electrode GE and the top surfaces ST_U of the device isolation patterns ST. The gate capping pattern CAP may extend along the top surface of the gate electrode GE in the second direction D2. Each of the gate spacers GSP may extend along a corresponding one of the side surfaces of the gate electrode GE in the second direction D2.

The source/drain patterns SD may be provided on the active pattern ACT at both sides of the gate structure GS. At least a portion of each of the source/drain patterns SD may be provided to penetrate an upper portion of the active pattern ACT. The active pattern ACT may include a portion that is provided below the gate structure GS and is interposed between the source/drain patterns SD. The source/drain patterns SD may be spaced apart from each other in a horizontal direction (e.g., in the first direction D1) with the portion of the active pattern ACT interposed therebetween. The lowermost bottom surface SD_L of each of the source/drain patterns SD may be located at a height lower than that of the uppermost top surface ACT_U of the active pattern ACT, where the height is measured from the substrate 100. The uppermost top surface of the portion of the active pattern ACT may correspond to the uppermost top surface ACT_U of the active pattern ACT. The gate structure GS and the source/drain patterns SD may constitute a transistor, and the portion of the active pattern ACT may be used as a channel region of the transistor.

The barrier layer 150 may be interposed between each of the source/drain patterns SD and the active pattern ACT. The barrier layer 150 may be interposed between the lowermost bottom surface SD_L of each of the source/drain patterns SD and the active pattern ACT, and may extend between the side surface SD_S of each of the source/drain patterns SD and the portion of the active pattern ACT, e.g., the barrier layer 150 may have a "U"-shaped cross-section. Each of the source/drain patterns SD may be spaced apart from the active pattern ACT with the barrier layer 150 interposed therebetween.

Except for the described differences above, the semiconductor device according to the present embodiments may be configured to have substantially the same features as those of the semiconductor device previously described with reference to FIGS. 1 and 2.

FIGS. 11 to 14 are sectional views along lines I-I' and II-II' of FIG. 9 to illustrate a method of fabricating a semiconductor device according to some embodiments. For concise description, an element or step previously described with reference to FIGS. 1 to 6 may be identified by the same reference number without repeating an overlapping description thereof.

Figure 11:
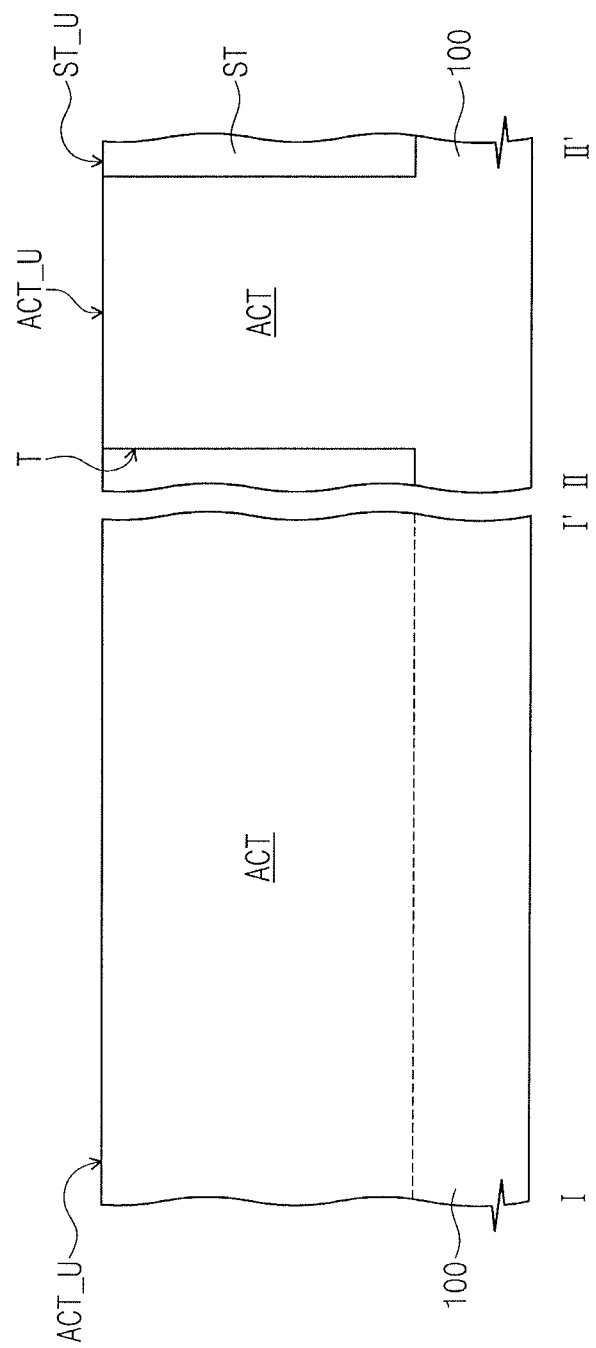
FIGS. 11 to 14 illustrate sectional views, along lines I-I' and II-II' of FIG. 9, of stages in a method of fabricating a semiconductor device according to embodiments.

Referring to FIGS. 9 and 11, the upper portion of the substrate 100 may be patterned to form the trenches T defining the active pattern ACT. The active pattern ACT may extend in the first direction D1. The trenches T may be spaced apart from each other in the second direction D2 with the active pattern ACT interposed therebetween. The formation of the trenches T may include forming a mask pattern on the substrate 100 to define a region, on which the active pattern ACT will be formed, and then anisotropically etching the upper portion of the substrate 100 using the mask pattern as an etch mask.

The device isolation patterns ST may be respectively formed at both sides of the active pattern ACT. The device isolation patterns ST may be formed to fill the trenches T, respectively. The formation of the device isolation patterns ST may include forming an insulating layer on the substrate 100 to fill the trenches T and planarizing the insulating layer to expose the active pattern ACT. The mask pattern may be removed during the planarization process. Accordingly, the top surface ST_U of each of the device isolation patterns ST may be substantially coplanar with the uppermost top surface ACT_U of the active pattern ACT. For example, the top surface ST_U of each of the device isolation patterns ST may be located at substantially the same height as that of the uppermost top surface ACT_U of the active pattern ACT, when measured from the substrate 100.

Figure 12:
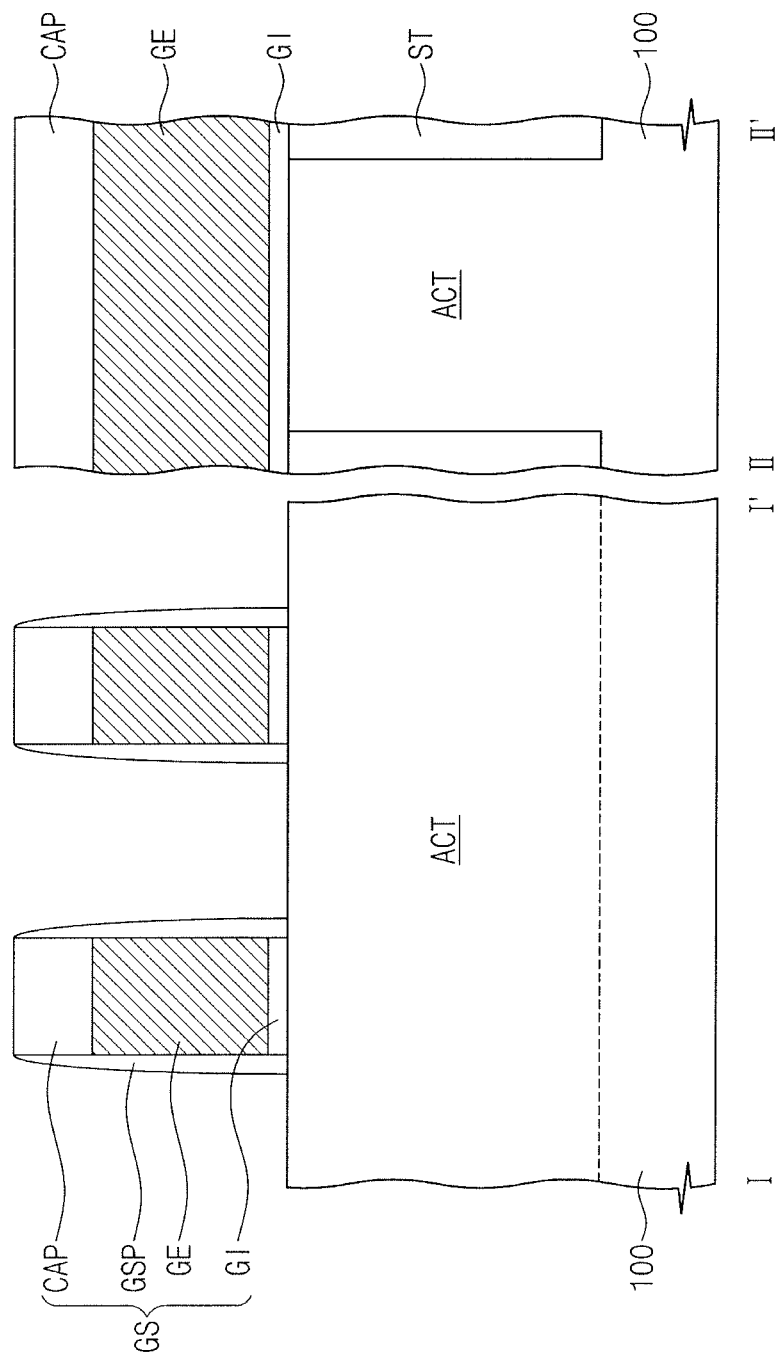

Referring to FIGS. 9 and 12, the gate structure GS may be formed on the substrate 100 to cross the active pattern ACT. The gate structure GS may be provided to extend in the second direction D2 and to cross the device isolation patterns ST. The gate structure GS may include the gate dielectric pattern GI, the gate electrode GE, and the gate capping pattern CAP, which are sequentially stacked on the substrate 100. The gate structure GS may further include the gate spacers GSP, which are respectively provided on the side surfaces of the gate electrode GE. The gate structure GS may be formed by substantially the same method as that described with reference to FIGS. 1 and 4.

Figure 13:
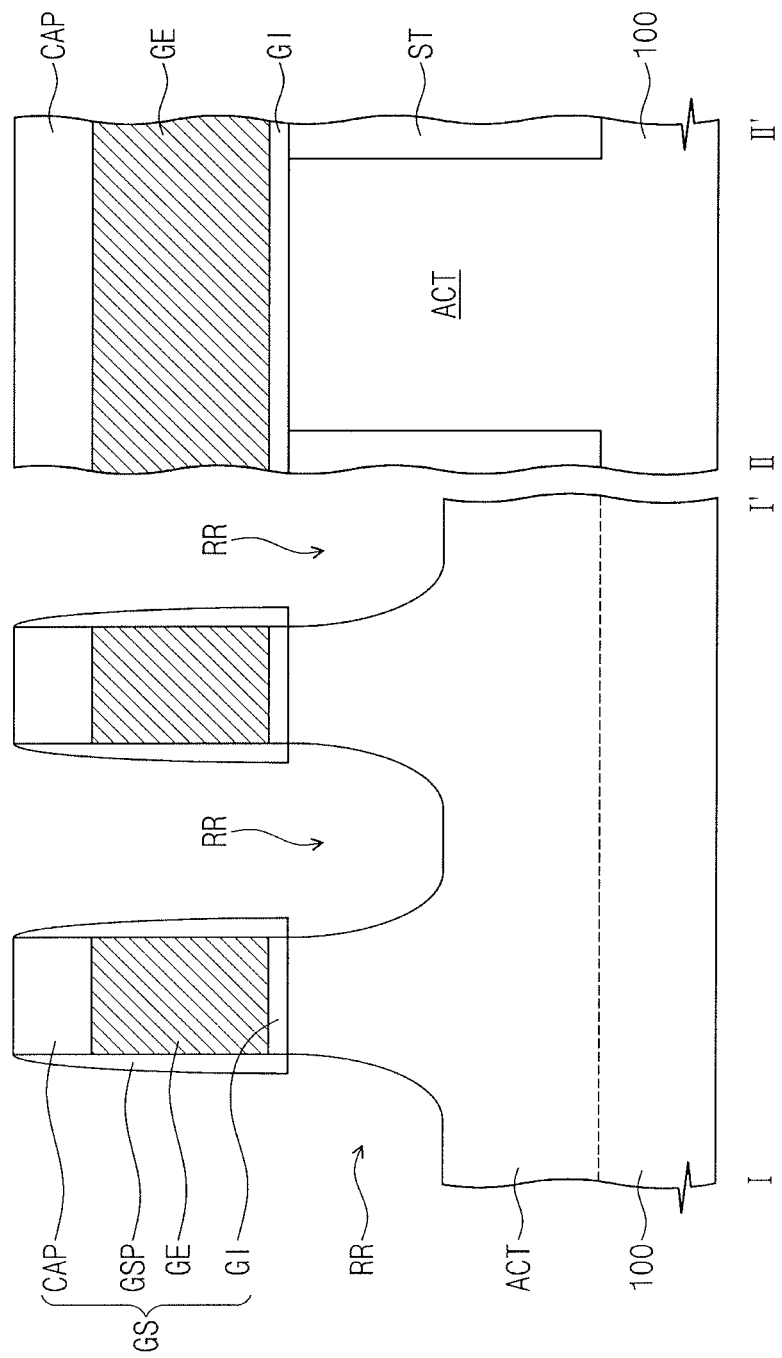

Referring to FIGS. 9 and 13, the recess regions RR may be formed by recessing upper portions of the active pattern ACT, which are respectively located at both sides of the gate structure GS. The formation of the recess regions RR may include performing a dry or wet etching process to etch the upper portions of the active pattern ACT. In some embodiments, the recess regions RR may extend below the gate spacers GSP.

Figure 14:
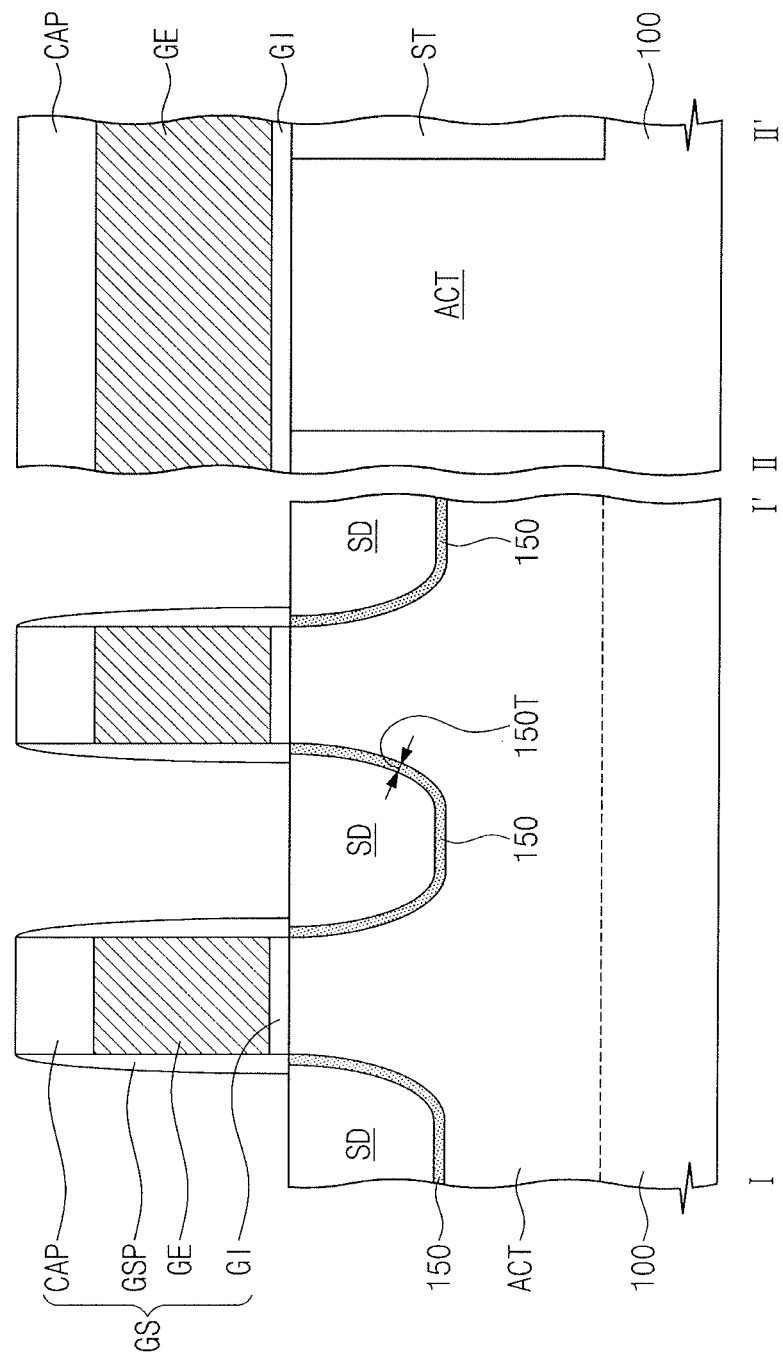

Referring to FIGS. 9 and 14, the source/drain patterns SD may be formed on the active pattern ACT at both sides of the gate structure GS. The source/drain patterns SD may be formed in the recess regions RR, respectively. The barrier layer 150 may be formed to be interposed between each of the source/drain patterns SD and the active pattern ACT. The barrier layer 150 may be formed in each of the recess regions RR. The barrier layer 150 may be provided to fill a portion of each of the recess regions RR, and each of the source/drain patterns SD may be provided to fill a remaining portion of each of the recess regions RR. The barrier layer 150 may be formed to conformally cover an inner surface of each of the recess regions RR. Each of the source/drain patterns SD may be spaced apart from the active pattern ACT with the barrier layer 150 interposed therebetween. The source/drain patterns SD and the barrier layer 150 may be formed by substantially the same method as that described with reference to FIGS. 1 and 6.

Except for the described differences above, the method of fabricating a semiconductor device according to the present embodiments may be performed in substantially the same manner as that previously described with reference to FIGS. 1 to 6.

Figure 15:
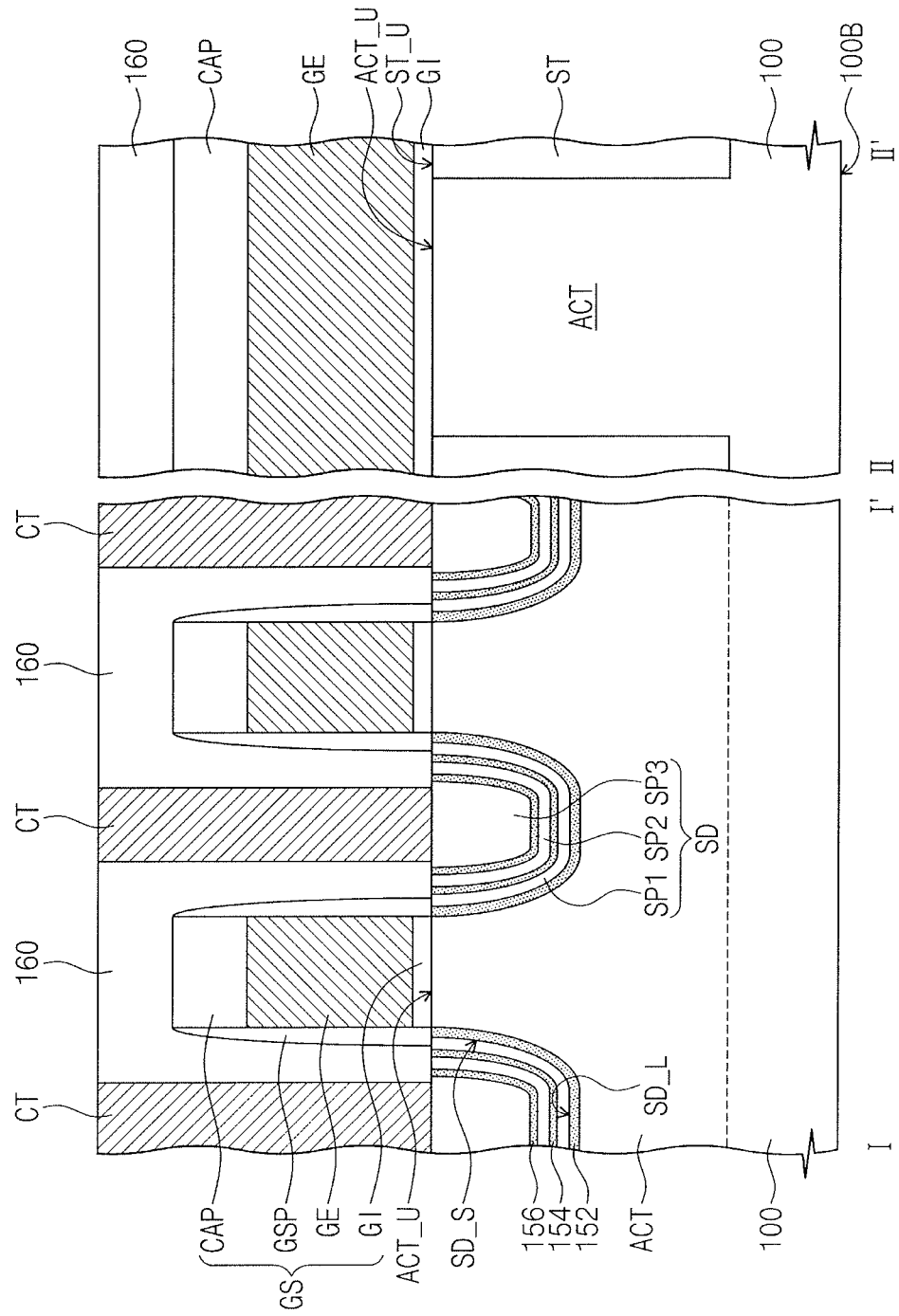
FIG. 15 illustrates a sectional view, along lines I-I' and II-II' of FIG. 9, of a semiconductor device according to embodiments.

FIG. 15 is a sectional view along lines I-I' and II-II' of FIG. 9 to illustrate a semiconductor device according to some embodiments. For concise description, an element previously described with reference to FIGS. 1 and 2 may be identified by the same reference number without repeating an overlapping description thereof.

Referring to FIGS. 9 and 15, the active pattern ACT may be provided on the substrate 100, and the device isolation patterns ST may be provided on the substrate 100 at both sides of the active pattern ACT. In the present embodiments, the active pattern ACT and the device isolation patterns ST may be provided to have substantially the same features as those of the active pattern ACT and the device isolation patterns ST described with reference to FIGS. 9 and 10. As an example, the top surface ST_U of each of the device isolation patterns ST may be substantially coplanar with the uppermost top surface ACT_U of the active pattern ACT. For example, the top surface ST_U of each of the device isolation patterns ST may be located at substantially the same height as that of the uppermost top surface ACT_U of the active pattern ACT, when measured from the substrate 100.

The gate structure GS may be provided to cross the active pattern ACT and the device isolation patterns ST. The gate structure GS may cover the uppermost top surface ACT_U of the active pattern ACT and the top surface ST_U of each of the device isolation patterns ST. In the present embodiments, the gate structure GS may be configured to have substantially the same features as those of the gate structure GS described with reference to FIGS. 9 and 10.

The source/drain patterns SD may be provided on the active pattern ACT at both sides of the gate structure GS. At least a portion of each of the source/drain patterns SD may be provided to penetrate an upper portion of the active pattern ACT. The active pattern ACT may include a portion that is provided below the gate structure GS and is interposed between the source/drain patterns SD. The source/drain patterns SD may be spaced apart from each other in a horizontal direction (e.g., in the first direction D1) with the portion of the active pattern ACT interposed therebetween. The lowermost bottom surface SD_L of each of the source/drain patterns SD may be located at a height lower than that of the uppermost top surface ACT_U of the active pattern ACT, where the height is measured from the substrate 100. The uppermost top surface of the portion of the active pattern ACT may correspond to the uppermost top surface ACT_U of the active pattern ACT. The gate structure GS and the source/drain patterns SD may constitute a transistor, and the portion of the active pattern ACT may be used as a channel region of the transistor.

Each of the source/drain patterns SD may include the first, second, and third semiconductor patterns SP1. SP2, and SP3, which are sequentially stacked on the active pattern ACT. The first semiconductor pattern SP1 may be interposed between the second semiconductor pattern SP2 and the active pattern ACT and may extend between the second semiconductor pattern SP2 and the portion of the active pattern ACT. The second semiconductor pattern SP2 may be spaced apart from the active pattern ACT with the first semiconductor pattern SP1 interposed therebetween. The second semiconductor pattern SP2 may be interposed between the third semiconductor pattern SP3 and the active pattern ACT and may extend between the third semiconductor pattern SP3 and the portion of the active pattern ACT. The third semiconductor pattern SP3 may be spaced apart from the active pattern ACT with the first and second semiconductor patterns SP1 and SP2 interposed therebetween. In the present embodiments, the source/drain patterns SD may be configured to have substantially the same features as those of the source/drain patterns SD described with reference to FIGS. 1 and 7.

The first barrier layer 152 may be interposed between each of the source/drain patterns SD and the active pattern ACT. The first barrier layer 152 may be interposed between the lowermost bottom surface SD_L of each of the source/drain patterns SD and the active pattern ACT, and may extend between the side surface SD_S of each of the source/drain patterns SD and the portion of the active pattern ACT, e.g., the first barrier layer 152 may have a "U"-shaped cross-section. The lowermost bottom surface SD_L of each of the source/drain patterns SD may correspond to the lowermost bottom surface of the first semiconductor pattern SP1, and the side surface SD_S of each of the source/drain patterns SD may correspond to the side surface of the first semiconductor pattern SP1. Each of the source/drain patterns SD may be spaced apart from the active pattern ACT with the first barrier layer 152 interposed therebetween. The first barrier layer 152 may be interposed between the first semiconductor pattern SP1 and the active pattern ACT and may extend between the first semiconductor pattern SP1 and the portion of the active pattern ACT. The first semiconductor pattern SP1 may be spaced apart from the active pattern ACT with the first barrier layer 152 interposed therebetween.

The second barrier layer 154 may be interposed between the first semiconductor pattern SP1 and the second semiconductor pattern SP2. The second barrier layer 154 may be interposed between the second semiconductor pattern SP2 and the active pattern ACT, and may extend between the second semiconductor pattern SP2 and the portion of the active pattern ACT, e.g., the second barrier layer 154 may have a "U"-shaped cross-section. The first semiconductor pattern SP1 and the second semiconductor pattern SP2 may be spaced apart from each other with the second barrier layer 154 interposed therebetween. The third barrier layer 156 may be interposed between the second semiconductor pattern SP2 and the third semiconductor pattern SP3. The third barrier layer 156 may be interposed between the third semiconductor pattern SP3 and the active pattern ACT, and may extend between the third semiconductor pattern SP3 and the portion of the active pattern ACT, e.g., the third barrier layer 156 may have a "U"-shaped cross-section. The second semiconductor pattern SP2 and the third semiconductor pattern SP3 may be spaced apart from each other with the third barrier layer 156 interposed therebetween. In the present embodiments, the first to third barrier layers 152, 154, and 156 may be configured to have substantially the same features as those of the first to third barrier layers 152, 154, and 156 described with reference to FIGS. 1 and 7.

Except for the described differences above, the semiconductor device according to the present embodiments may be configured to have substantially the same features as those of the semiconductor device previously described with reference to FIGS. 1 and 2.

Figure 16:
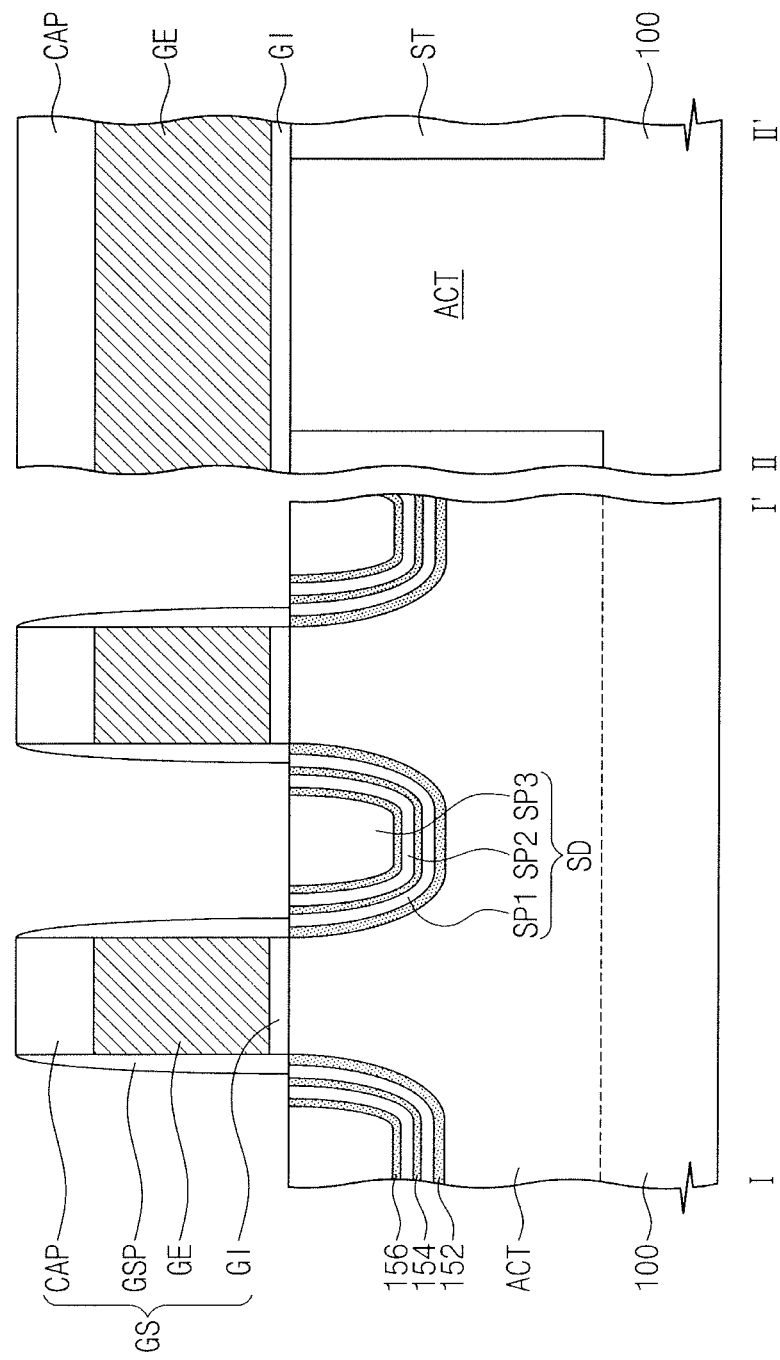
FIG. 16 illustrates a sectional view, along lines I-I' and II-II' of FIG. 9, of a stage in a method of fabricating a semiconductor device according to embodiments.

FIG. 16 is a sectional view along lines I-I' and II-II' of FIG. 9 to illustrate a method of fabricating a semiconductor device according to some embodiments of the inventive concept. For concise description, an element or step previously described with reference to FIGS. 1 to 6 may be identified by the same reference number without repeating an overlapping description thereof.

As described with reference to FIGS. 9 and 11 to 13, the active pattern ACT may be formed on the substrate 100, and the device isolation patterns ST may be formed on the substrate 100 at both sides of the active pattern ACT. The gate structure GS may be formed to cross the active pattern ACT and the device isolation patterns ST. Thereafter, the recess regions RR may be formed by recessing upper portions of the active pattern ACT, which are respectively located at both sides of the gate structure GS.

Referring to FIGS. 9 and 16, the source/drain patterns SD may be formed on the active pattern ACT at both sides of the gate structure GS. The source/drain patterns SD may be formed in the recess regions RR, respectively. The source/drain patterns SD may be formed by substantially the same method as that described with reference to FIGS. 1 and 8. For example, the formation of the source/drain patterns SD may include performing a selective epitaxial growth process, which uses the active pattern ACT as a seed layer, to sequentially form the first, second, and third semiconductor patterns SP1, SP2, and SP3, and here, each of the first to third semiconductor patterns SP1, SP2, and SP3 may be doped with impurities during or after the selective epitaxial growth process.

The first barrier layer 152 may be formed to be interposed between each of the source/drain patterns SD and the active pattern ACT. The first barrier layer 152 may be formed in each of the recess regions RR to conformally cover an inner surface of each of the recess regions RR. The second barrier layer 154 and third barrier layer 156 may be interposed between the first and second semiconductor patterns SP1 and SP2 and between the second and third semiconductor patterns SP2 and SP3, respectively. The first to third barrier layers 152, 154, and 156 may be formed by substantially the same method as that described with reference to FIGS. 1 and 8.

Except for the above described differences, the method of fabricating a semiconductor device according to the present embodiments may be performed in substantially the same manner as that previously described with reference to FIGS. 1 to 6.

According to embodiments, since the barrier layer is interposed between each of the source/drain patterns SD and the active pattern ACT, it may be possible to suppress or prevent impurities in the source/drain patterns SD from being diffused into the active pattern ACT. In the case where the source/drain patterns SD include a plurality of semiconductor patterns SP1, SP2, and SP3, a plurality of barrier layers may be respectively interposed between the plurality of semiconductor patterns SP1, SP2, and SP3. Accordingly, it may be possible to suppress or prevent an impurity inter-diffusion between the plurality of semiconductor patterns SP1, SP2, and SP3. Since at least one barrier layer prevents the impurities from being diffused into neighboring patterns, it may be possible to improve a concentration profile of the impurities in the source/drain patterns SD.

In addition, since the impurities are prevented from being diffused into neighboring patterns by the at least one barrier layer, a thermal treatment process may be performed on the source/drain patterns SD at a relatively high temperature. Accordingly, it may be possible to increase an extent of activation of the impurities in the source/drain patterns SD and thereby to reduce electric resistance of the source/drain patterns SD. Therefore, a semiconductor device with improved electric characteristics and a method of fabricating the same may be provided.

Figure 17:
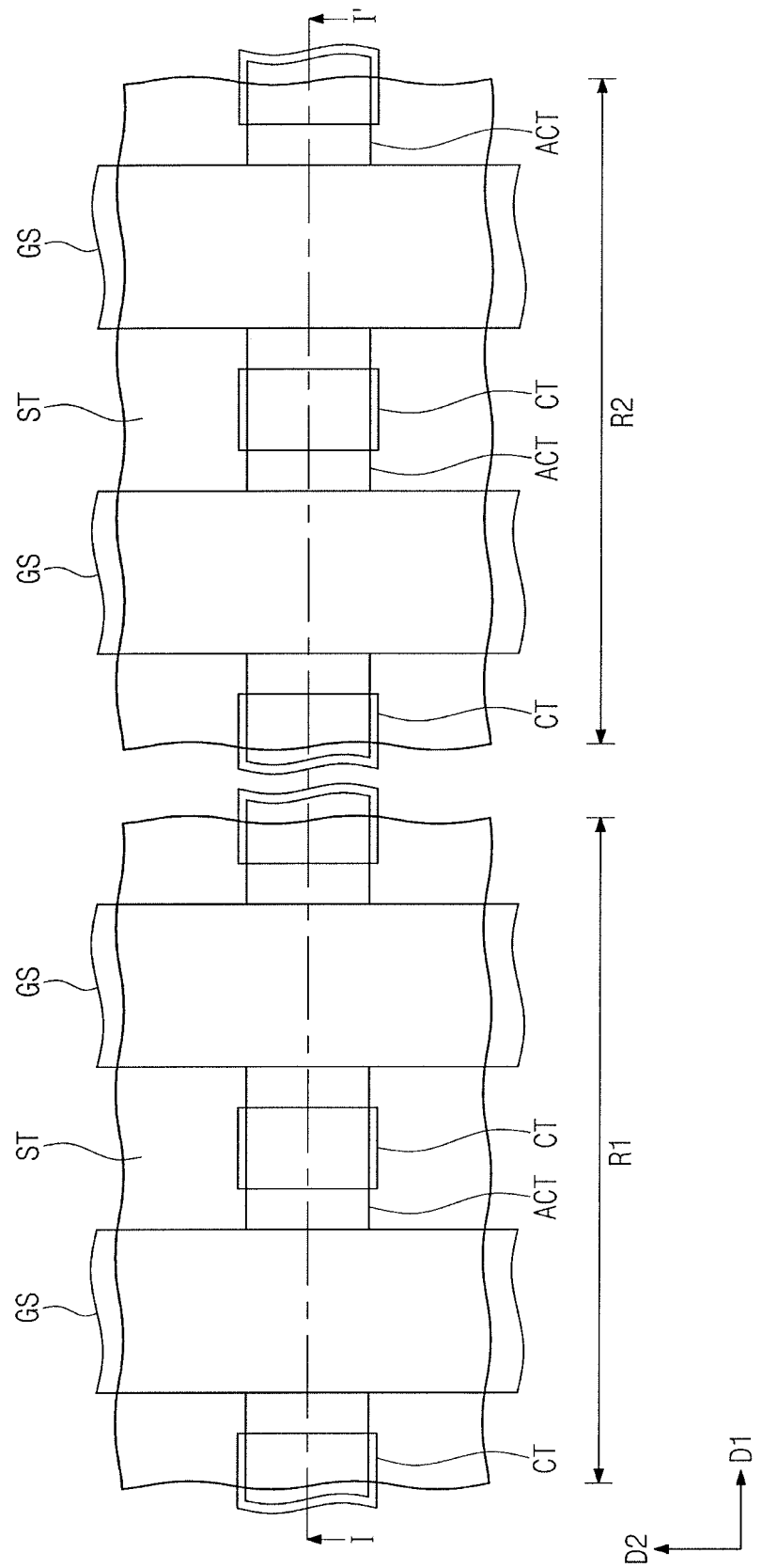
FIG. 17 illustrates a plan view of a semiconductor device according to embodiments.
Figure 18:
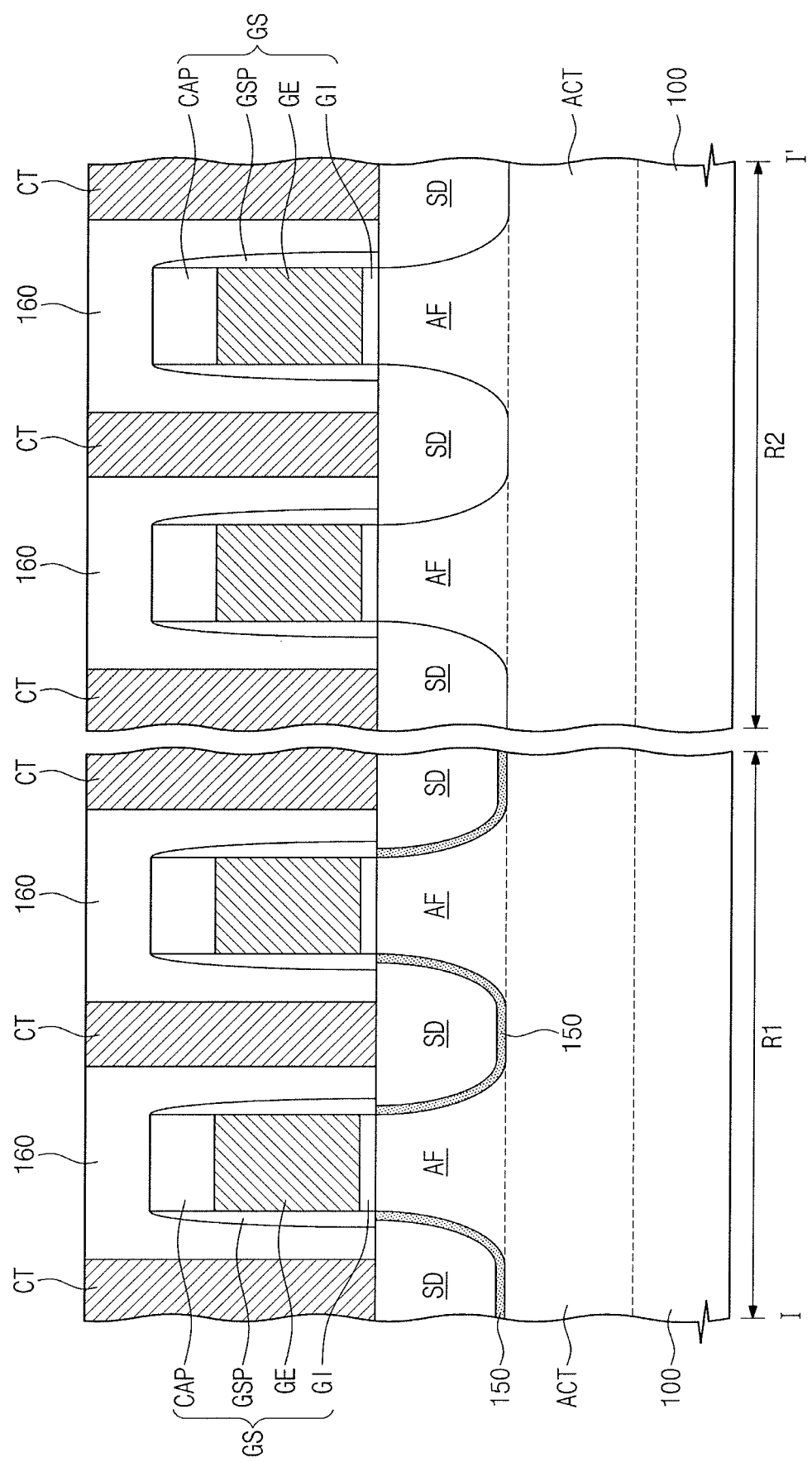
FIG. 18 illustrates a sectional view along line I-I' of FIG. 17.

FIG. 17 is a plan view illustrating a semiconductor device according to some embodiments. FIG. 18 is a sectional view along line I-I' of FIG. 17.

Referring to FIGS. 17 and 18, the substrate 100 may include a first region R1 and a second R2, e.g., adjacent to each other along the first direction D1. Each of the first and second regions R1 and R2 may include an active pattern ACT with active fins AF and gate structures GS, as described previously with reference to FIGS. 1-2 and/or with reference to FIGS. 9-10. For example, the gate structure GS and the source/drain patterns SD in the first region R1 may constitute a first transistor, e.g., PMOSFET or NMOSFET, and the gate structure GS and the source/drain patterns SD in the second region R2 may constitute a second transistor. e.g., PMOSFET or NMOSFET.

For example, as further illustrated in FIGS. 17-18, the structure of the first transistor in the first region R1 may be substantially the same as the structure described previously with reference to FIGS. 1-2, i.e., including the barrier layer 150, while the structure of the second transistor in the second region R2 may not include a barrier layer. In other words, the structures in the first and second regions R1 and R2 may be substantially the same, with the exception of the second transistor in the second region R2 not having a barrier layer between the source/drain patterns SD and the active pattern ACT.

By way of summation and review, embodiments provide a semiconductor device with improved electric characteristics and a method of fabricating the same. That is, according to embodiments, at least one barrier layer containing oxygen may be provided between the source/drain pattern and the active pattern to suppress or prevent diffusion of impurities from the source/drain pattern into neighboring patterns. Accordingly, it may be possible to improve a concentration profile of the impurities in the source/drain pattern. In addition, it may be possible to perform a thermal treatment process on the source/drain pattern at a relatively high temperature, and this may make it possible to increase an extent of activation of the impurities in the source/drain pattern. As a result, electric resistance of the source/drain pattern may be reduced. Accordingly, a semiconductor device with improved electric characteristics and a method of fabricating the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
at least one active pattern on a substrate;
at least one gate electrode intersecting the at least one active pattern;
source/drain regions on the at least one active pattern, the source/drain regions being on opposite sides of the at least one gate electrode;
a barrier layer between at least one of the source/drain regions and the at least one active pattern, the barrier layer being at least on a bottom of the at least one of the source/drain regions, and the barrier layer including oxygen; and
spacers on opposite sidewalls of the at least one gate electrode, at least one of the spacers overlapping and directly contacting both a topmost surface of the barrier layer and a topmost surface of the at least one of the source/drain regions.

2. The semiconductor device as claimed in claim 1, wherein the barrier layer is between each one of the source/drain regions and the at least one active pattern, the barrier layer being conformal along each of the bottoms of the source/drain regions.

3. The semiconductor device as claimed in claim 2, wherein:
the at least one active pattern includes recesses, the source/drain regions being in the recesses, and
the barrier layer is conformal along an entirety of each of the recesses.

4. The semiconductor device as claimed in claim 1, wherein the barrier layer completely separates each source/drain region from the at least one active pattern.

5. The semiconductor device as claimed in claim 1, wherein the barrier layer extends continuously along the bottom and corresponding sidewalls of each of the source/drain regions.

6. The semiconductor device as claimed in claim 1, wherein the barrier layer is a silicon oxide layer separating each one of the source/drain regions from the at least one active pattern.

7. The semiconductor device as claimed in claim 6, wherein the silicon oxide layer has a thickness of about 2 angstroms to about 5 angstroms.

8. The semiconductor device as claimed in claim 1, further comprising at least one other barrier layer within the at least one of the source/drain regions, the at least one other barrier layer being spaced apart from the barrier layer.

9. The semiconductor device as claimed in claim 8, wherein the at least one other barrier layer includes a same material as the barrier layer.

10. The semiconductor device as claimed in claim 9, wherein each of the barrier layer and the at least one other barrier layer has a thickness of about 2 angstroms to about 5 angstroms.

11. The semiconductor device as claimed in claim 1, wherein the at least one active pattern is a finFET pattern.

12. The semiconductor device as claimed in claim 1, wherein the barrier layer is only between some of the source/drain regions and the at least one active pattern.

13. A semiconductor device, comprising:
at least one active finFET pattern on a substrate;
at least one gate electrode intersecting the at least one active finFET pattern;
source/drain regions on the at least one finFET pattern, the source/drain regions being on opposite sides of the at least one gate electrode;
a barrier layer between each one of the source/drain regions and the at least one finFET pattern, the barrier layer being conformal along bottoms of the source/drain regions, and the barrier layer including oxygen; and spacers on opposite sidewalls of the at least one gate electrode, at least one of the spacers overlapping and directly contacting both a topmost surface of the barrier layer and a topmost surface of a corresponding one of the source/drain regions.

14. The semiconductor device as claimed in claim 13, wherein the barrier layer is conformal along bottoms and corresponding sidewalls of each of the source/drain regions.

15. The semiconductor device as claimed in claim 13, wherein the at least one active finFET pattern is a seed layer of the source/drain regions.

16. The semiconductor device as claimed in claim 13, wherein a thickness of the barrier layer is smaller than a horizontal width of a bottom of the at least one of the spacers.

17. The semiconductor device as claimed in claim 13, wherein the barrier layer is a silicon oxide layer having a thickness of about 2 angstroms to about 5 angstroms.

18. A semiconductor device, comprising:
    at least one active pattern on a substrate;
    at least one gate electrode intersecting the at least one active pattern;
    source/drain regions on the at least one active pattern, the source/drain regions being on opposite sides of the at least one gate electrode;
    a first barrier layer between each one of the source/drain regions and the at least one active pattern, the first barrier layer being at least on a bottom of the at least one of the source/drain regions, and the first barrier layer including oxygen;
    spacers on opposite sidewalls of the at least one gate electrode, at least one of the spacers overlapping and directly contacting both a topmost surface of the first barrier layer and a topmost surface of the at least one of the source/drain regions; and
    a second barrier layer between a topmost surface of each one of the source/drain region and a corresponding first barrier layer, the first and second barrier layers being spaced apart from each other,
    wherein the first barrier layer is a silicon oxide layer separating each one of the source/drain regions from the at least one active pattern.

19. The semiconductor device as claimed in claim 18, wherein the first barrier layer is continuous along an entire interface between each of the source/drain regions and the at least one active pattern.

20. The semiconductor device as claimed in claim 19, wherein each of the first and second barrier layers is a silicon oxide layer formed by an epitaxial growth process.

21. The semiconductor device as claimed in claim 19, wherein the second barrier layer has a same shape as the first barrier layer.

* * * * *